United States Patent
Kurose et al.

(10) Patent No.: US 11,755,236 B2
(45) Date of Patent: Sep. 12, 2023

(54) MEMORY SYSTEM

(71) Applicant: Kioxia Corporation, Tokyo (JP)

(72) Inventors: Kengo Kurose, Suginami (JP); Masanobu Shirakawa, Chigasaki (JP); Naomi Takeda, Yokohama (JP); Hideki Yamada, Yokohama (JP)

(73) Assignee: Kioxia Corporation, Tokyo (JP)

( * ) Notice: Subject to any disclaimer, the term of this patent is extended or adjusted under 35 U.S.C. 154(b) by 26 days.

(21) Appl. No.: 17/201,092

(22) Filed: Mar. 15, 2021

(65) Prior Publication Data

US 2022/0066688 A1 Mar. 3, 2022

(30) Foreign Application Priority Data

Aug. 28, 2020 (JP) .................. 2020-144789

(51) Int. Cl.
*G06F 3/00* (2006.01)
*G06F 3/06* (2006.01)
(52) U.S. Cl.
CPC .......... *G06F 3/0655* (2013.01); *G06F 3/0604* (2013.01); *G06F 3/0679* (2013.01)
(58) Field of Classification Search
CPC ..... G06F 3/0655; G06F 3/0604; G06F 3/0679
See application file for complete search history.

(56) References Cited

U.S. PATENT DOCUMENTS

| | | | |
|---|---|---|---|
| 6,920,062 B2 | 7/2005 | Parkin | |
| 9,953,051 B2* | 4/2018 | Wen | .......... G06F 16/2322 |
| 2013/0250677 A1* | 9/2013 | Nam | .......... G11C 16/10 |
| | | | 365/185.03 |
| 2020/0089567 A1* | 3/2020 | Takeda | .......... G06F 11/1048 |

FOREIGN PATENT DOCUMENTS

| | | |
|---|---|---|
| JP | 2020-27802 A | 2/2020 |
| JP | 2020-46916 A | 3/2020 |

* cited by examiner

*Primary Examiner* — Craig S Goldschmidt
(74) *Attorney, Agent, or Firm* — Oblon, McClelland, Maier & Neustadt, L.L.P.

(57) ABSTRACT

According to one embodiment, a shift register memory writes data having a first size corresponding to a capacity of a block to a plurality of layers of a plurality of data storing shift strings included in the block, in response to a first command sequence specifying a first write mode from a controller. In response to a second command sequence specifying a second write mode from the controller, the shift register memory writes data having a second size smaller than the capacity of the block to the plurality of layers of one or more first data storing shift strings of the plurality of data storing shift strings, without writing data to each of other data storing shift strings except the one or more first data storing shift strings.

9 Claims, 30 Drawing Sheets

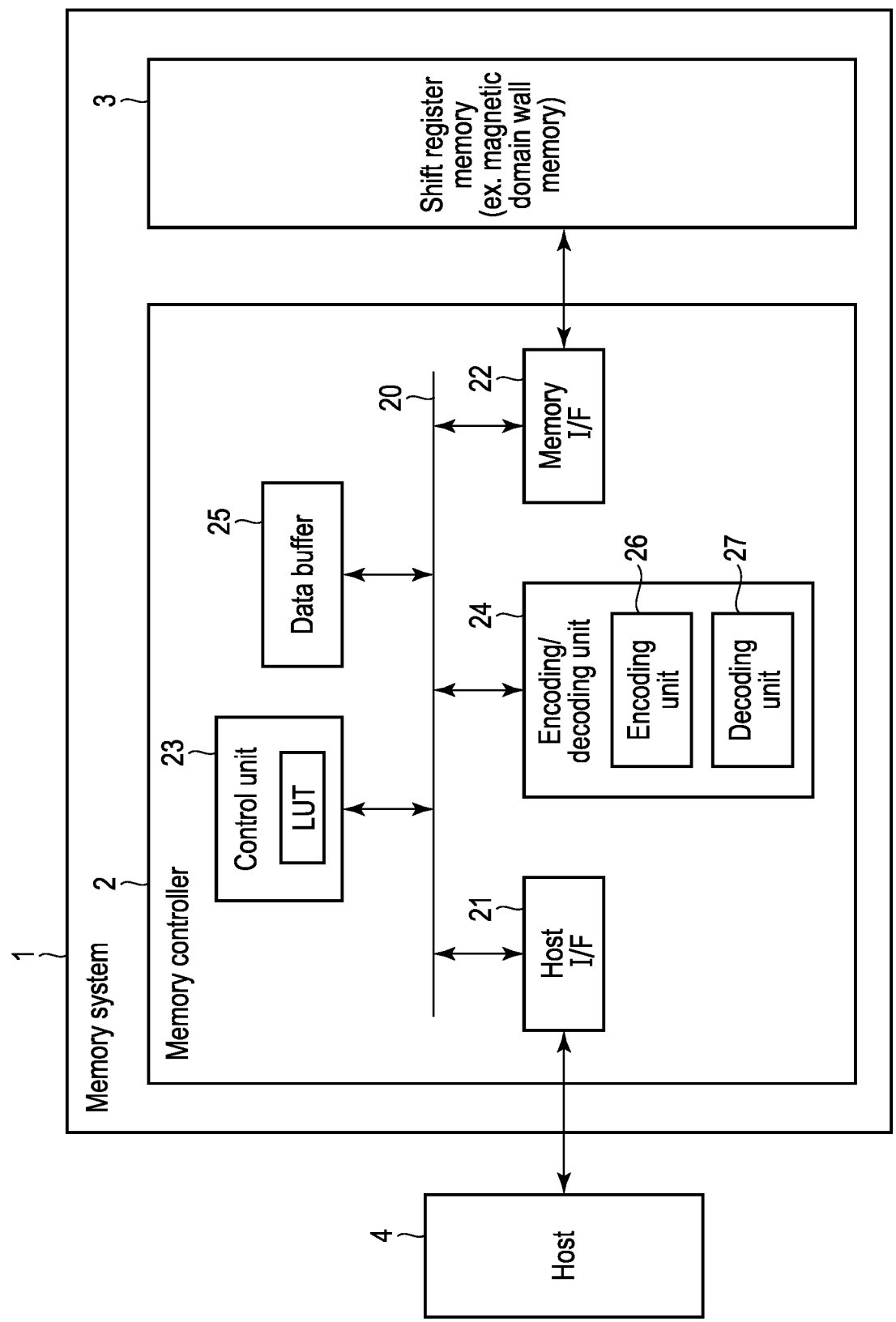
F I G. 1

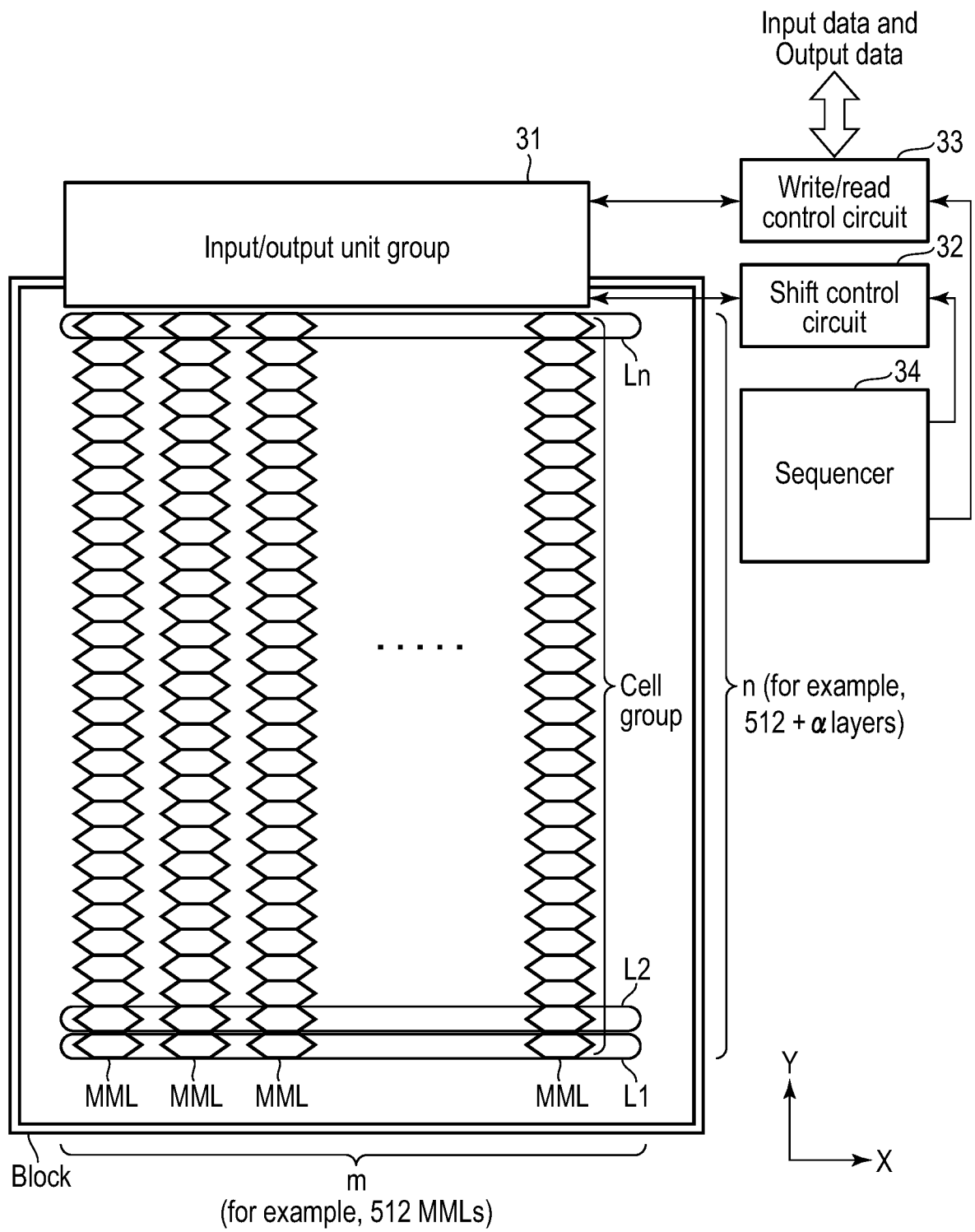
F I G. 3

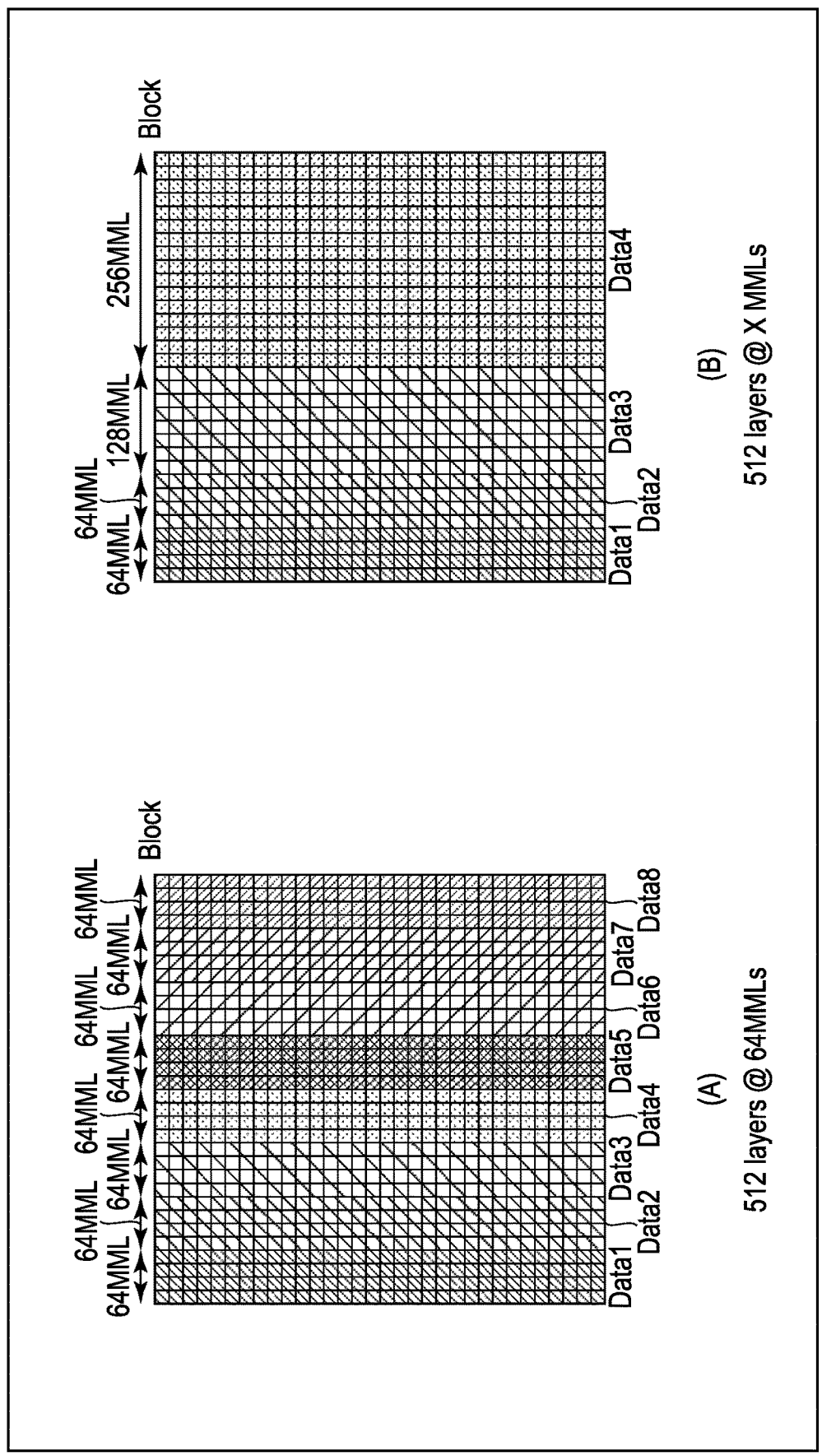
F I G. 13

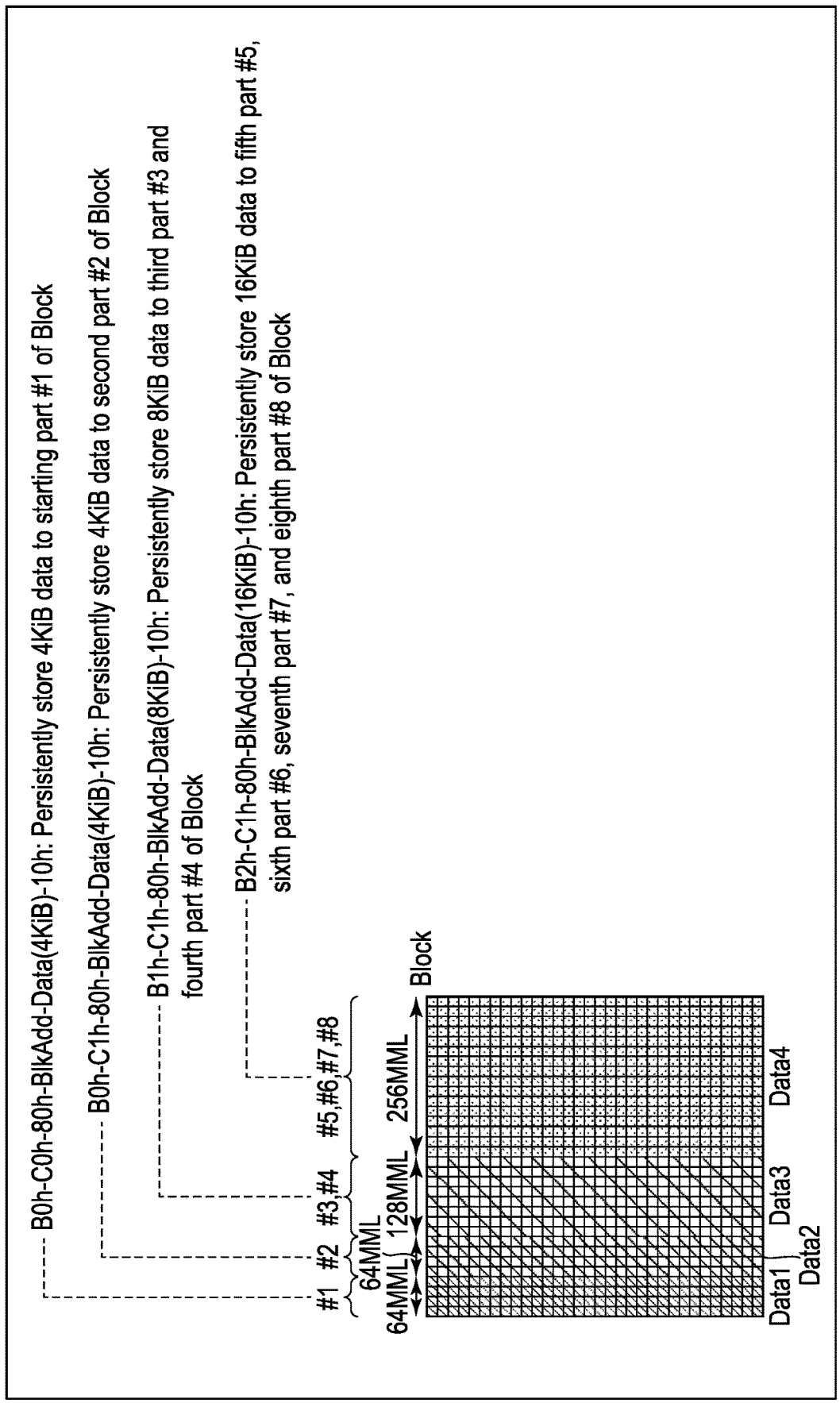
F I G. 20

| | Maximum number of times of read shift | Minimum number of times of read shift | Memory effective use rate |
|---|---|---|---|
| Comparative example | 512 | 64 | 100% |
| First embodiment | 512 | 512 | 100% |
| Second embodiment | 64 | 64 | 12.5% |
| Third embodiment | 256 | 256 | 50% |

F I G. 27

MEMORY SYSTEM

CROSS-REFERENCE TO RELATED APPLICATIONS

This application is based upon and claims the benefit of priority from Japanese Patent Application No. 2020-144789, filed Aug. 28, 2020, the entire contents of which are incorporated herein by reference.

FIELD

Embodiments described herein relate generally to a technique for controlling a shift resister memory.

BACKGROUND

In recent years, memory systems comprising nonvolatile memories are widely prevailing. As such a memory system, a solid state drive (SSD) comprising a NAND flash memory is known.

Recently, development of a shift resister memory as a next-generation nonvolatile memory has started.

Implement of a memory system useful for control of a shift resister memory is therefore required.

BRIEF DESCRIPTION OF THE DRAWINGS

FIG. 1 is a block diagram illustrating a configuration example of a memory system according to a first embodiment.

FIG. 3 is a diagram illustrating a configuration example of a first-in last-out type magnetic domain wall memory (FILO type magnetic domain wall memory) which is an example of the shift resister memory.

FIG. 13 is a diagram illustrating the partial write operation of writing data to a multiple of 64 magnetic memory lines MML.

FIG. 20 is a diagram illustrating an example of several command sequences using a combination of two commands (BX command and CX command).

FIG. 27 is a diagram illustrating a maximum read shift count, a minimum read shift count, and a memory effective use rate on each of the partial write operation according to the comparative example, the partial write operation according to the first embodiment, the partial write operation according to the second embodiment, and the partial write operation according to the third embodiment.

DETAILED DESCRIPTION

Figure 2:
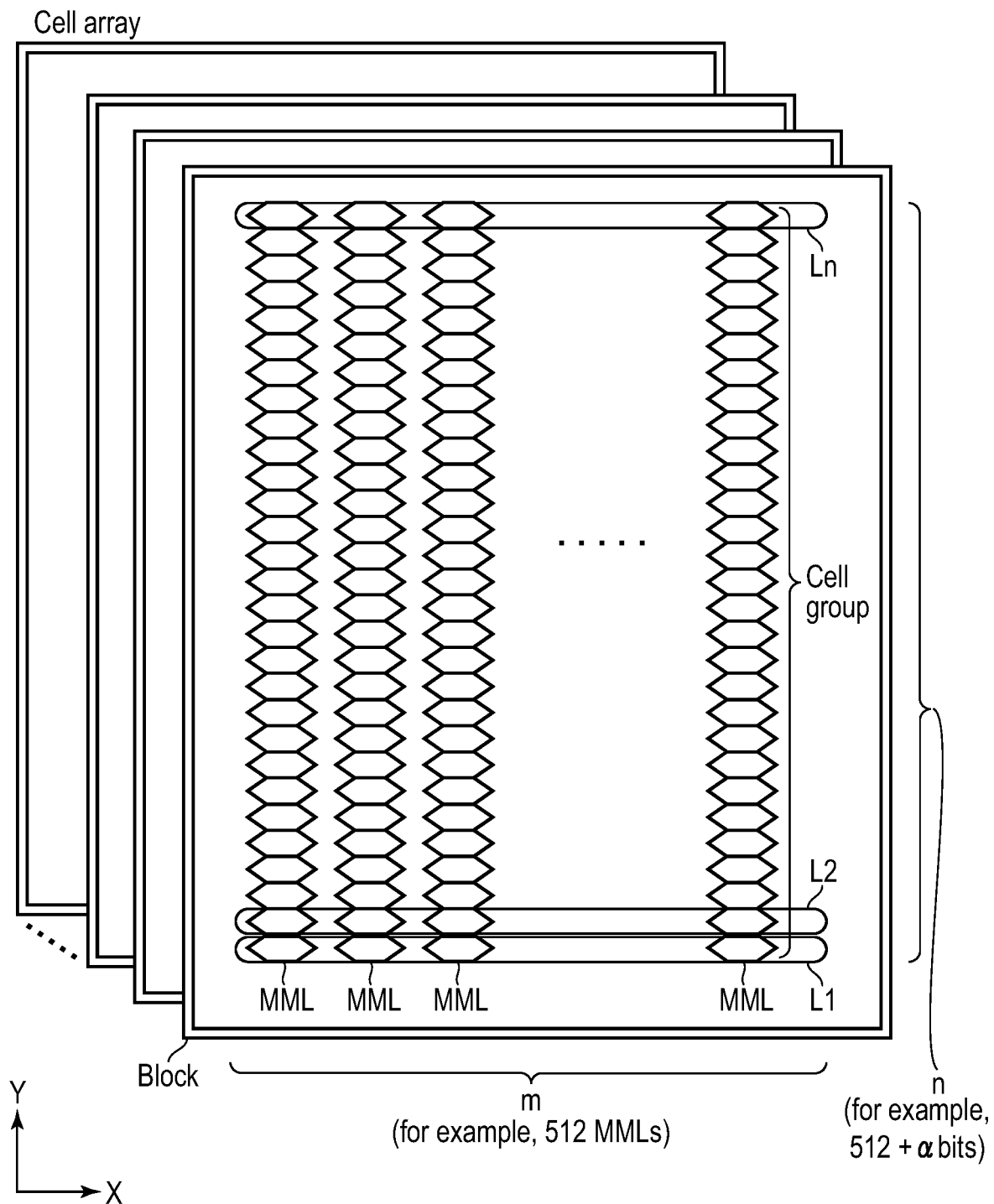
FIG. 2 is a diagram illustrating a configuration example of a cell array of a shift resister memory included in the memory system according to the first embodiment.

Embodiments will be described hereinafter with reference to the accompanying drawings.

In general, according to one embodiment, a memory system comprises a shift resister memory and a controller. The shift register memory comprises a block including a plurality of data storing shift strings each including a plurality of layers and is configured to execute writing and reading data by a first-in last-out method or a first-in first-out method by repeating an operation of shifting data stored in each of the layers of each of the plurality of data storing shift strings, by one layer, in a direction along each of the plurality of data storing shift strings. The controller is configured to control the shift register memory by selectively using a first write mode and a second write mode. In response to a first command sequence specifying the first write mode from the controller, the shift register memory writes data having a first size corresponding to a capacity of the block, to the plurality of layers of the plurality of data storing shift strings. In response to a second command sequence specifying the second write mode from the controller. The shift register memory writes data having a second size smaller than the capacity of the block to the plurality of layers of one or more first data storing shift strings, of the plurality of data storing shift strings, without writing data to each of other data storing shift strings except the one or more first data storing shift strings, of the plurality of data storing shift strings.

First Embodiment

FIG. 1 illustrates a configuration example of a memory system 1 according to a first embodiment. The memory system 1 includes a controller (memory controller) 2 and a shift register memory 3. The memory system 1 is capable of being connected to a host 4. FIG. 1 illustrates a state in which the memory system 1 is connected to the host 4. The host 4 is an electronic device such as a personal computer, a server, a mobile terminal or the like.

The shift register memory 3 is a memory which persistently stores data. The shift register memory 3 is configured to execute writing and read the data in a certain capacity unit referred to as a block or a physical block, in the first-in last-out method (also referred to as a last-in first-out method) or the first-in first-out method.

The shift register memory 3 includes a plurality of blocks. Each of the plurality of blocks functions as a unit of executing writing and reading the data in the first-in last-out method or the first-in first-out method. Each of the plurality of blocks includes a plurality of data storing shift strings.

Each of the data storing shift strings includes a plurality of layers and functions as a shift register. Each of the plurality of layers included in the data storing shift string can store the data. In other words, each of the plurality of layers included in the data storing shift string functions as a stage of the shift register. A starting layer in each data storing shift string corresponds to the first stage of the shift register, and the end layer in each data storing shift string corresponds to the last stage of the shift register.

The shift register memory 3 executes writing and reading data by a first-in last-out method or a first-in first-out method by repeating an operation of shifting data stored in each of the layers of each of the plurality of data storing shift strings, by one layer, in a direction along each of the plurality of data storing shift strings.

More specifically, the shift register memory 3 is configured to execute a write operation including both an operation of inputting data to a starting layer of each of the plurality of data storing shift strings and an operation of shifting data stored in each layer of each of the plurality of data storing shift strings by one layer in a first direction from the starting layer to the end layer, at a plurality of times, and thereby write the data of the block size to this block. The write operation including the operation of inputting the data and the operation of shifting is executed at the number of times corresponding to the number of the plurality of layers included in each data storing shift string. The block size corresponds to the capacity of one block.

In addition, the shift register memory 3 executes an operation of shifting data stored in each layer of each of the plurality of data storing shift strings by one layer in a second direction from the end layer to the starting layer, at a plurality of times, and thereby read the data of the block size from this block (first-in last-out method). Alternatively, the shift register memory 3 executes an operation of shifting data stored in each layer of each of the plurality of data storing shift strings by one layer in the first direction, at a plurality of times, and thereby read the data of the block size from this block (first-in first-out method).

One of examples of the shift register memory 3 which executes writing and reading the data in the first-in last-out method or the first-in first-out method is a magnetic domain wall memory. The magnetic domain wall memory executes writing and reading the data while shifting (moving) each magnetic domain wall by allowing a current to flow through a magnetic shift register which can store a plurality of magnetizations. Implementing the shift register memory 3 in the memory system 1 by a magnetic domain wall memory will be mainly described below. However, the configuration and operations of the shift register memory 3 of the first embodiment can be applied not only to a magnetic domain wall memory, but to other various shift register memories.

The memory system 1 may be implemented as a solid state drive (SSD) or may be implemented as a memory card in which the memory controller 2 and the shift register memory 3 are configured as one package.

The memory controller 2 controls writing data to the shift register memory 3 in response to a write request (write command) received from the host 4. In addition, the memory controller 2 controls reading data from the shift register memory 3 in response to a read request (a read command) received from the host 4.

The controller 4 may be implemented by a circuit such as a System-on-a-chip (SoC). The memory controller 2 includes a host interface 21, a memory interface 22, a control unit 23, an encoding/decoding unit 24, and a data buffer 25. The host interface 21, the memory interface 22, the control unit 23, the encoding/decoding unit 24, and the data buffer 25 are connected to an internal bus 20.

The host interface 21 executes processes conforming to an interface standard between the host and devices, and outputs a request, user data, and the like, which are received from the host 4, to the internal bus 20. In addition, the host interface 21 transmits user data read from the shift register memory 3, a response received from the control unit 23, and the like to the host 4. In the embodiment, the data written to the shift register memory 3 in response to the write request from the host 4 is referred to as user data.

The memory interface 22 executes a write control operation of writing data to the shift register memory 3, based on an instruction from the control unit 23. In addition, the memory interface 22 executes a read control operation of reading data from the shift register memory 3, based on an instruction from the control unit 23.

The control unit 23 comprehensively controls each component of the memory system 1. The control unit 23 may be implemented by a CPU (processor).

When receiving the request from the host 4 via the host interface 21, the control unit 23 executes the control according to the request. For example, the control unit 23 instructs the memory interface 22 to write user data and parity to the shift register memory 3 based on the write request received from the host 4. In addition, the control unit 23 instructs the memory interface 22 to read the user data and parity from the shift register memory 3 based on the read request received from the host 4. The parity is indicative of an error correction code (ECC) that is a part of a code word obtained by encoding the user data.

The write request specifies a logical address, a size of write data to be written, and the like. The logical address specified by the write request is indicative of a logical address to which write data is to be written. The read request specifies a logical address, a size of data to be read, and the like. The logical address specified by the read request is indicative of a logical address corresponding to the data to be read.

In addition, when receiving the write request from the host 4, the control unit 23 determines a storage area (memory area) on the shift register memory 3 to which the user data received from the host 4 and stored in the data buffer 25 is to be written. That is, the control unit 23 manages a write destination of the user data. The control unit 23 manages mapping information indicative of mapping between a logical address specified by the write request received from the host 4 and a physical address indicative of a storage area on the shift register memory 3 in which the user data corresponding to the logical address is stored, by using a lookup table (LUT) which functions as an address translation table. The lookup table (LUT) may be stored in a RAM (dynamic RAM (DRAM)) or a static RAM (SRAM) in the memory system 1 or may be stored persistently in the shift register memory 3. In the latter case, when the memory system 1 is powered on, the LUT may be loaded from the shift register memory 3 into the RAM in the memory system 1.

In addition, when receiving the read request from the host 4, the control unit 23 translates a logical address specified by the read request into a physical address by using the above-mentioned address translation table (LUT), and instructs the memory interface 22 to read the data from the physical address.

The data buffer 25 temporarily stores the user data received from the host 4. In addition, the data buffer 25 temporarily stores the user data read from the shift register memory 3. In addition, the data buffer 25 temporarily stores a code word generated by encoding the user data, i.e., an error correction code (ECC) frame. The ECC frame includes the user data and ECC corresponding to the user data. The data buffer 25 is constituted by, for example, the above-mentioned RAM (SRAM or DRAM).

The user data transmitted from the host 4 is transferred to the internal bus 20 and stored in the data buffer 25. The encoding/decoding unit 24 encodes data to be written to the shift register memory 3 to generate an ECC frame. For example, encoding the data is executed in a unit of a predetermined size such as 4 KiB. In this case, one ECC frame includes 4 KiB data and the ECC corresponding to the 4 KiB data. Each ECC frame is also referred to as a page.

Any coding may be used. For example, Reed Solomon (RS) coding, Bose Chaudhuri Hocquenghem (BCH) coding, or Low Density Parity Check (LDPC) coding may be used. The encoding/decoding unit 24 comprises an encoding unit 26 and a decoding unit 27.

Basically, the memory controller 2 controls the shift register memory 3 such that writing and reading data to and from the shift register memory 3 are executed in units of data having a size corresponding to a block size. The block size corresponds to the capacity of one block. For this reason, each of the plurality of blocks included in the shift register memory 3 functions as a unit of executing writing and reading the data in the first-in last-out method or the first-in first-out method. For this reason, even if read target data specified by the host 4 is only a part of the data stored in a certain block, the memory controller 2 reads all the data in this block from the shift register memory 3. The memory controller 2 re-encodes all the data that have been read in units of pages and writes back the re-encoded data to the same block or a different block. This is because when data is read from each block in the shift register memory 3, the data is lost from the shift register memory 3.

To simplify descriptions, it is mainly assumed below that the shift register memory 3 includes one memory chip. However, the embodiments can also be applied to a configuration in which the shift register memory 3 includes a plurality of memory chips. Each of the memory chips may have a multi-plane structure of comprising a plurality of planes each including a plurality of blocks.

FIG. 2 illustrates a configuration example of the memory cell array included in the shift resister memory 3. A configuration example of a memory cell array will be described below by using specific numerical values to make the embodiments easily understood. However, these numerical values are mere examples. The embodiments are not limited to these specific numerical values but any numerical values can be applied to the configuration of the memory cell array of the embodiments.

The memory cell array includes a plurality of blocks. It is assumed here that each of the blocks includes a total of n layers, i.e., layer L1 to layer Ln. In this example, n is an integer of 2 or more. These n layers function as a plurality of stages of the shift register. The layer Ln corresponds to the first stage of the shift register and the layer L1 corresponds to the last stage of the shift register.

The layers L1 to Ln of one block can be implemented by a plurality of data storing shift strings included in this block. When the shift register memory 3 is implemented by the magnetic domain wall memory, the plurality of data storing shift strings can be implemented by a plurality of magnetic memory lines MMLs. The number of magnetic memory lines MML included in the block is not limited. However, it is assumed here that each of the blocks includes m magnetic memory lines MMLs. In this example, m is an integer of 2 or more.

The magnetic memory line MML is a magnetic shift register and corresponds to the data storing shift string of the shift register memory 3. The magnetic memory line MML is implemented by, for example, an elongate magnetic substance extending in one direction. The magnetic memory line MML is often referred to as a magnetic narrow wire, a memory hole, or a magnetic memory string.

In the block, the magnetic memory line MML extends in the Y (columnar) direction and includes a plurality of cells that can store the magnetization. Each of a plurality of micro regions arranged in the longitudinal direction of the elongate magnetic substance constituting the magnetic memory line MML functions as a cell.

These cells of each magnetic memory line MML are the elements of the layer L1 to the layer Ln of the block. The plurality of cells included in m magnetic memory lines MMLs are arranged as a plurality of layers (layer L1 to layer Ln) extending in the X (row) direction. For example, the layer Ln of the block includes a set of m cells located on one-end side of each of m magnetic memory lines MMLs, and the layer L1 of the block includes a set of m cells located on the other end side of each of m magnetic memory lines MMLs.

Each of the cells of each magnetic memory line MML is also referred to as the layer in the magnetic memory line MML. In other words, one block is composed of m magnetic memory lines MMLs each including n layers.

In FIG. 2, a set of a plurality of hexagons continuous in the Y (columnar) direction is indicative of one magnetic memory line MML. One hexagon is indicative of one cell in the magnetic memory line MML (i.e., a layer in the magnetic memory line MML). Corner-rounded rectangles extending in the X direction across m magnetic memory lines MMLs are indicative of the layers L1 to Ln in the block.

In each magnetic memory line MML, the magnetization direction of the magnetization stored in each cell (layer) may be used as information indicative of "1" or "0". In this case, when one magnetic memory line MML includes n layers, the magnetic memory line MML can store up to n-bit data.

Alternatively, the magnetization direction of the single magnetization may not correspond to "1" or "0", but a combination of the magnetization directions of two adjacent magnetizations may be used as information indicative of "1" or "0". In this case, the combination of two adjacent magnetizations having the same magnetization direction may correspond to "0" and the combination of two adjacent magnetizations having different magnetization directions may correspond to "1". When the magnetic memory line MML includes n layers, the magnetic memory line MML can store up to n−1-bit data.

For example, it is assumed that one block has the capacity capable of storing 32 KiB data. In this case, in an example that the number of magnetic memory lines MMLs included in one block is 512, each magnetic memory line MML may include 512+α layers. The block size of one block is, for example, 512×(512+α) bit=32 KiB+α'. α' (=512+α bit) are considered to be used as an area for storing ECC and an area for storing information to be stored together with the data. In this case, data of eight pages, i.e., eight ECC frames can be stored in one block. Each of the ECC frames includes 4 KiB data and ECC corresponding to the 4 KiB data.

FIG. 3 illustrates a configuration example of a first-in last-out (FILO) type magnetic domain wall memory which is an example of the shift resister memory 3.

In a LIFO type magnetic domain wall memory, each of the magnetic memory lines MMLs is accessed by the first-in last-out method in which a storage position of data previously written is moved to a back side when next data is written and that the data on the back side cannot be read until the data subsequently written is read.

One side ends of m magnetic memory lines MMLs included in each block are connected to m input/output units, respectively. Each of m input/output units may include a magnetoresistive element such as a magnetic tunnel junction (MTJ) element, and a selector.

In FIG. 3, the set of m input/output units is referred to as an input/output unit group 31. Writing the data to this block and reading the data from this block are executed via the input/output unit group 31.

The input/output unit group 31 is connected to each of a shift control circuit 32 and a write/read control circuit 33. Each of the shift control circuit 32 and the write/read control circuit 33 is controlled by a sequencer 34. The sequencer 34 is a control circuit configured to interpret and execute a command sequence from the memory controller 2.

In the write operation, the shift control circuit 32 shifts data of each layer in the block in the direction from the layer Ln to the layer L1. In the read operation, the shift control circuit 32 shifts the data of each layer in the block in the direction from the layer L1 to the layer Ln.

The shift control circuit 32 shifts the magnetic domain walls in each magnetic memory line MML by one layer by supplying a current pulse to each magnetic memory line MML in the block via the input/output unit group 31. The current pulse is also referred to as a shift pulse or a shift current. The magnetic domain wall is a boundary between the magnetizations having different polarities. In each magnetic memory line MML, each magnetic domain (magnetization) is shifted (moved) in a unit of one layer (that is, in a unit of 1-bit) according to movement of each magnetic domain wall. The write/read control circuit 33 controls writing data to the block and reading data from the block via the input/output unit group 31.

In the write operation of writing the data of a block size to the block, the sequencer 34 controls the shift control circuit 32 and the write/read control circuit 33 to set the write data of one layer in the input/output unit group 31 and to supply a current pulse to each of m magnetic memory lines MMLs. Thus, the write operation including both an operation of inputting the data from the input/output unit group 31 to the starting layer Ln of each of M magnetic memory lines MMLs and an operation of shifting the data stored in each layer of each of M magnetic memory lines MMLs, by one layer, in the direction from the layer Ln to the layer L1, is executed. The sequencer 34 controls the shift control circuit 32 and the write/read control circuit 33 to repeat executing the write operation at the number of times corresponding to the number of all layers included in the block. Thus, the data of a block size can be written to the block.

In the read operation of reading the data of a block size from the block, the sequencer 34 controls the shift control circuit 32 and the write/read control circuit 33 to repeat executing the operation of shifting the data stored in each layer of each of M magnetic memory lines MMLs by one layer in the direction from the layer L1 to the layer Ln, at the number of times corresponding to the number of all layers included in the block. Thus, the data of a block size can be read from the block via the input/output unit group 31. Every time the data of one layer is output from the block to the input/output unit group 31, the data is sensed by M MTJ elements in the input/output unit group 31 and the sensed data is stored in a latch circuit in the input/output unit group 31.

Figure 4:
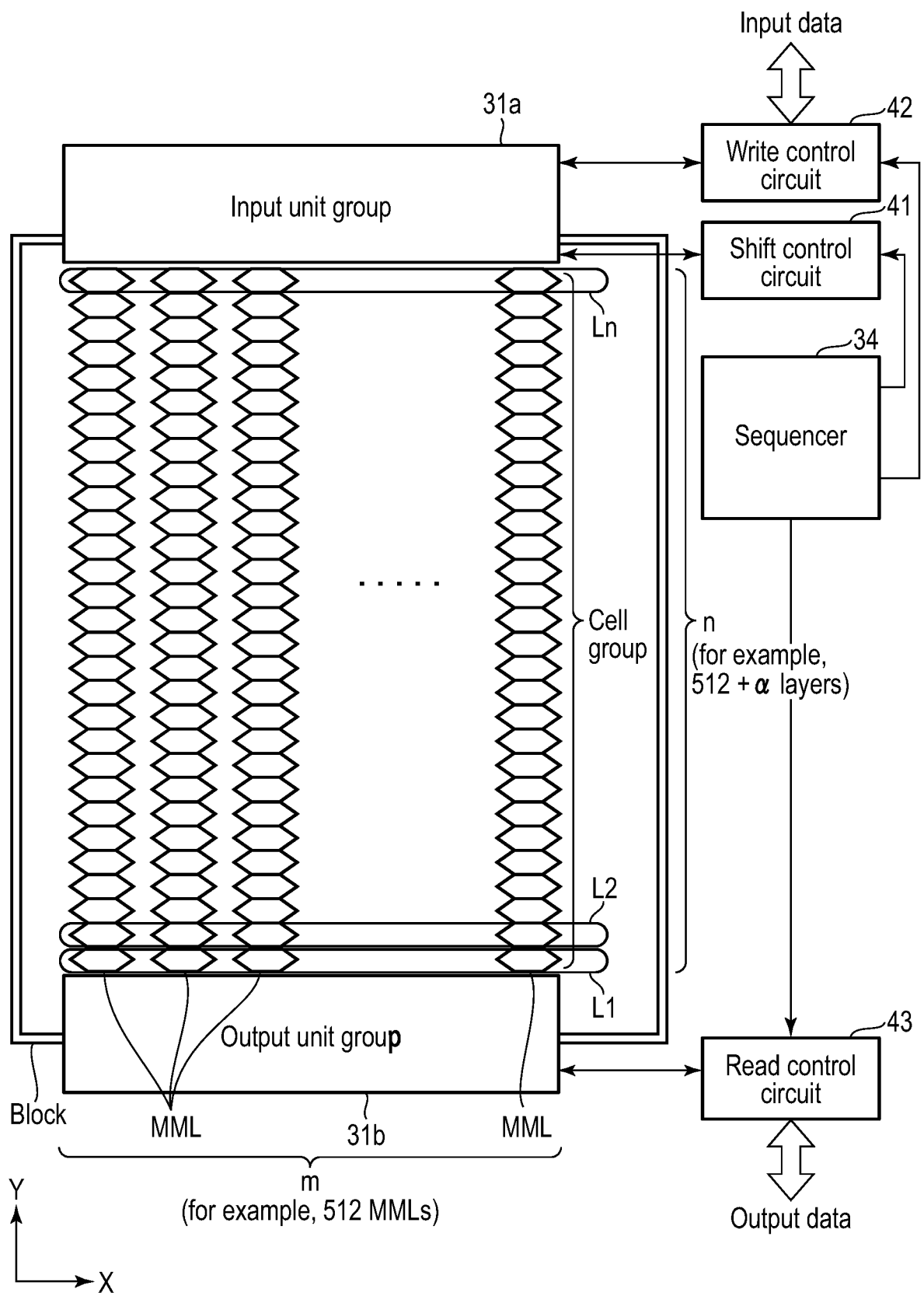
FIG. 4 is a diagram illustrating a configuration example of a first-in first-out type magnetic domain wall memory (FIFO type magnetic domain wall memory) which is an example of the shift resister memory.

FIG. 4 illustrates a configuration example of the first-in first-out (FIFO) type magnetic domain wall memory which is an example of the shift resister memory 3.

In the FIFO type magnetic domain wall memory, each of the magnetic memory lines MMLs is accessed by the first-in first-out method in which a storage position of data previously written is moved to a back side when next data is written and that the data are read in the same order as the order of writing the data.

One side ends of m magnetic memory lines MMLs included in each block are connected to m input units, respectively. In FIG. 4, the set of m input units is referred to as an input unit group 31a. Writing the data to this block is executed via the input unit group 31a.

The other side ends of m magnetic memory lines MMLs included in each block are connected to m output units, respectively. In FIG. 4, the set of m output units is referred to as an output unit group 31b. Reading the data from this block is executed via the output unit group 31b.

The input unit group 31a is connected to each of a shift control circuit 41 and a write control circuit 42. The shift control circuit 41 and the write control circuit 42 are controlled by the sequencer 34.

In the write operation, the shift control circuit 41 shifts the data of each layer in the block in the direction from the layer Ln to the layer L1. In the read operation, too, the shift control circuit 41 shifts the data of each layer in the block in the direction from the layer Ln to the layer L1. The write control circuit 42 controls writing the data to this block via the input unit 31a.

The output unit group 31b is connected to a read control circuit 43. The read control circuit 43 controls reading the data from this block via the output unit group 31b.

In the write operation of writing the data of a block size to the block, the sequencer 34 controls the shift control circuit 41 and the write control circuit 42 to set the write data of one layer in the input unit group 31a and to supply a current pulse to each of m magnetic memory lines MMLs. Thus, the write operation including both an operation of inputting the data from the input unit group 31a to the starting layer Ln of each of M magnetic memory lines MMLs and an operation of shifting the data stored in each layer of each of M magnetic memory lines MMLs, by one layer, in the direction from the layer Ln to the layer L1, is executed. The sequencer 34 controls the shift control circuit 41 and the write control circuit 42 to repeat executing the write operation at the number of times corresponding to the number of all layers included in the block. Thus, the data of a block size can be written to the block.

In the read operation of reading the data of a block size from the block, the sequencer 34 controls the shift control circuit 41 and the read control circuit 43 to repeat executing the operation of shifting the data stored in each layer of each of M magnetic memory lines MMLs by one layer in the direction from the layer Ln to the layer L1, at the number of times corresponding to the number of all layers included in the block. Thus, the data of a block size can be read from the block via the output unit group 31b. Every time the data of one layer is output from the block to the output unit group 31b, the data is sensed by M MTJ elements in the output unit group 31b and the sensed data is stored in a latch circuit.

Figure 5:
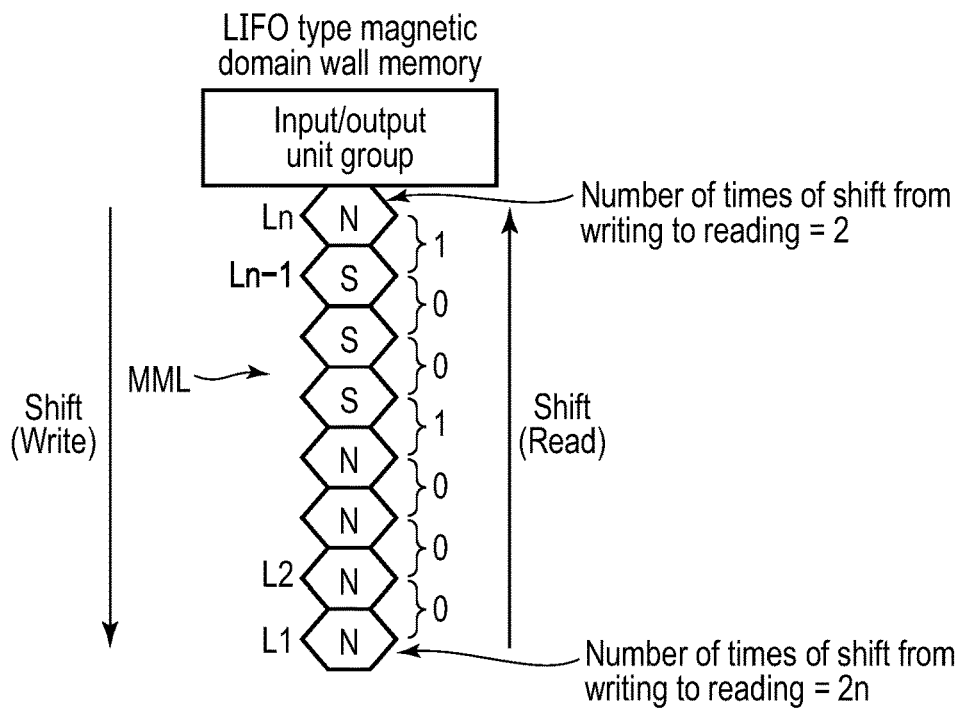
FIG. 5 is a diagram illustrating a shift operation when focusing one magnetic memory line (MML) in the FILO type magnetic domain wall memory.

FIG. 5 is a diagram illustrating a shift operation when focusing one magnetic memory line MML in the FILO type magnetic domain wall memory.

In FIG. 5, the polarity (magnetization direction) of each magnetization stored in the magnetic memory line MML is referred to as "S" or "N". As described above, the polarity of the single magnetization may be referred to as "1" or "0", or a combination of two adjacent magnetizations may be referred to as "1" or "0". The latter case is exemplified in FIG. 5. For example, the magnetization (in this example, magnetization N) stored in the layer L2 of the magnetic memory line MML has the same magnetization direction as the magnetization (in this example, magnetization S) stored in the layer L1 (parallel) and a set of two magnetizations corresponds to, for example, "0". In addition, the magnetization (in this example, magnetization N) stored in the layer Ln of the magnetic memory line MML has the magnetization direction opposite to the magnetization (in this example, magnetization S) stored in the layer Ln−1 (anti-parallel) and a set of two magnetizations corresponds to, for example, "1".

For example, in the operation of writing the data "1" to the magnetic memory line MML, the magnetization of the polarity opposite to the polarity of the magnetization of the layer Ln is set as the write data in the input/output unit, and a current pulse for shifting the magnetization of each layer, by one layer, in the direction from the layer Ln to the layer L1 (also referred to as downwardly) is supplied to the magnetic memory line MML. As a result, the magnetization of the polarity opposite to the polarity of the magnetization of the layer Ln is input to the layer Ln as the write data and, simultaneously, the magnetization of the individual layer is downwardly shifted by one layer.

In the reading operation, for example, whether the read data is "1" or "0" can be determined based on whether the resistance state of the magnetoresistive element is varied or not when two magnetizations are sequentially read from the magnetic memory line MML. In the read operation, first, an operation of shifting the magnetization of each layer by one layer in the direction from the layer L1 to the layer Ln (also referred to as an upward direction) is executed. Thus, the magnetization of the layer Ln is read from the magnetic memory line MML and the magnetizations of the respective layers L1 to Ln−1 are shifted to the layers L2 to Ln.

Then, the operation of shifting the magnetization of each layer by one layer in the upward direction is executed again. Since the magnetization which has been originally present in the layer Ln−1 is present in the layer Ln, this magnetization is read from the magnetic memory line MML and the magnetizations of the respective layers L2 to Ln−1 are shifted to the layers L3 to Ln.

Writing the data to and reading the data from one magnetic memory line MML have been described. Basically, however, writing the data to and reading the data from all the magnetic memory lines MMLs included in the same block are executed in parallel.

In the write operation of writing the data of a block size to the block, the number of times of shifting the data finally stored in the layer L1 is n. In the read operation of reading the data of a block size from the block, the number of times of shifting the data stored in the layer L1 is n. Therefore, the total number of times of shifting from writing the data to reading the data is 2n. For example, when the number of layers in the block is 512, the total number of times of shifting from writing the data to reading the data is 1024.

In contrast, as regards the data finally stored in the layer Ln, the total number of times of shifting from writing the data to reading the data is 2.

Thus, in the shift register memory 3 such as the FILO type magnetic domain wall memory, the number of times of shifting the data on the layer side (hereinafter referred to as an upper layer side) close to the layer Ln is greatly different from that of shifting the data on the layer side (hereinafter referred to as a lower layer side) close to the layer L1. A deviation that the number of times of shifting the data stored in a layer closer to the layer L1 increases is generated. For this reason, as regards the data finally stored in the layer on the lower layer side, an error (bit error) resulting from a shift failure can easily be accumulated. The shift failure is a phenomenon that the magnetic domain wall cannot be shifted as expected and an error is thereby caused to occur in the data of several layers.

In addition, in the shift register memory 3 such as a FILO type magnetic domain wall memory, since all the data stored on the upper layer side than the layer where the read target data is stored need to be read, the time required for read access to the data stored in the lower layer is basically longer.

Figure 6:
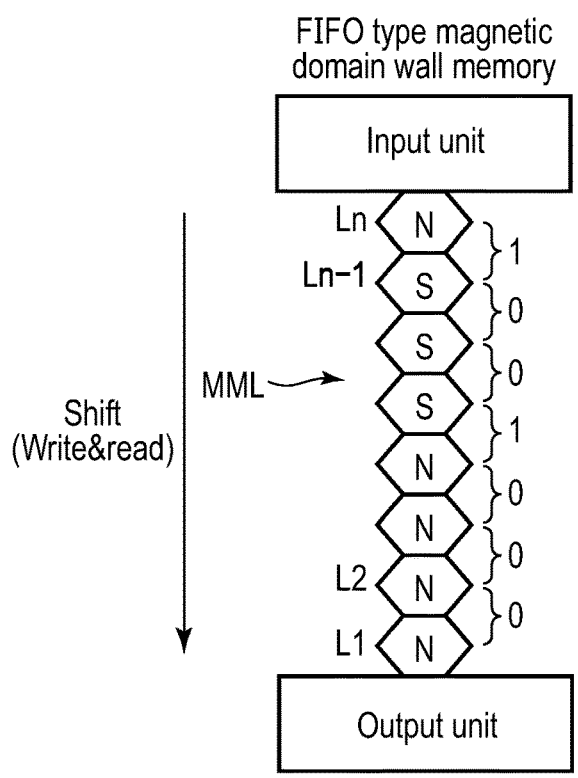
FIG. 6 is a diagram illustrating a shift operation when focusing one MML of the FIFO type magnetic domain wall memory.

FIG. 6 is a diagram illustrating a shift operation when focusing one magnetic memory line (MML) of the FIFO type magnetic domain wall memory.

In FIG. 6, similarly to FIG. 5, the polarity (magnetization direction) of each magnetization stored in the magnetic memory line MML is referred to as "S" or "N". In the FIFO type magnetic domain wall memory, too, the polarity of the single magnetization may be referred to as "1" or "0", or a combination of two adjacent magnetizations may be referred to as "1" or "0". The latter case is exemplified in FIG. 6.

In the write operation, the operation of downwardly shifting the magnetization of each layer by one layer is executed similarly to the FILO type magnetic domain wall memory. Thus, the magnetization of each layer is downwardly shifted by one layer, and the magnetization corresponding to the write data is input to the layer Ln. Therefore, in the write operation of writing the data of a block size to the block, the number of times of shifting the data finally stored in the layer L1 is n. The number of times of shifting the data finally stored in the layer Ln is 1.

In the read operation, too, the shift operation of downwardly shifting the magnetization of each layer in a unit of layer is executed similarly to the write operation. Thus, the data stored in the layer L1 is read from the magnetic memory line MML, and the data stored in the respective layer L2 to the layer Ln are downwardly shifted by one layer.

The number of times of shifting required to read the data stored in the layer L1 is 1 and the number of times of shifting required to read the data stored in the layer Ln is n. Since all the data stored on the lower layer side than the layer where the read target data is stored need to be read, the time required for read access to the data stored in the upper layer is basically longer. In addition, as regards the data stored in the layer on the upper layer side, an error (bit error) resulting from a shift failure can easily be accumulated.

Next, the operation of writing the data of a block size to the block will be described. The operation of writing the data of a block size to the block is also referred to as "block write operation" or "write operation using a block write mode".

Figure 7A:
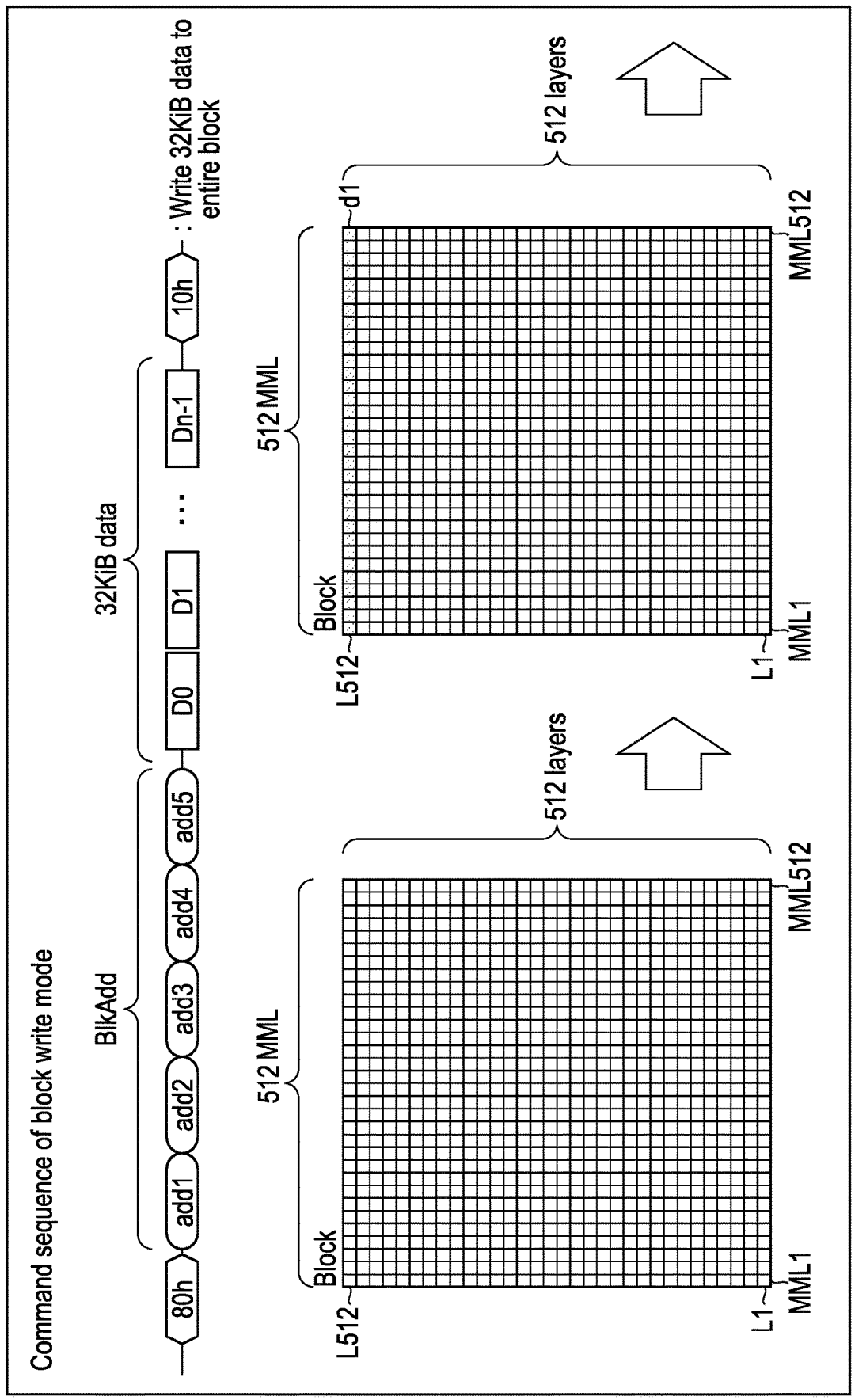
FIG. 7A is a diagram illustrating a part of a block write operation of writing data of a block size to an entire block of the shift resister memory.
Figure 7B:
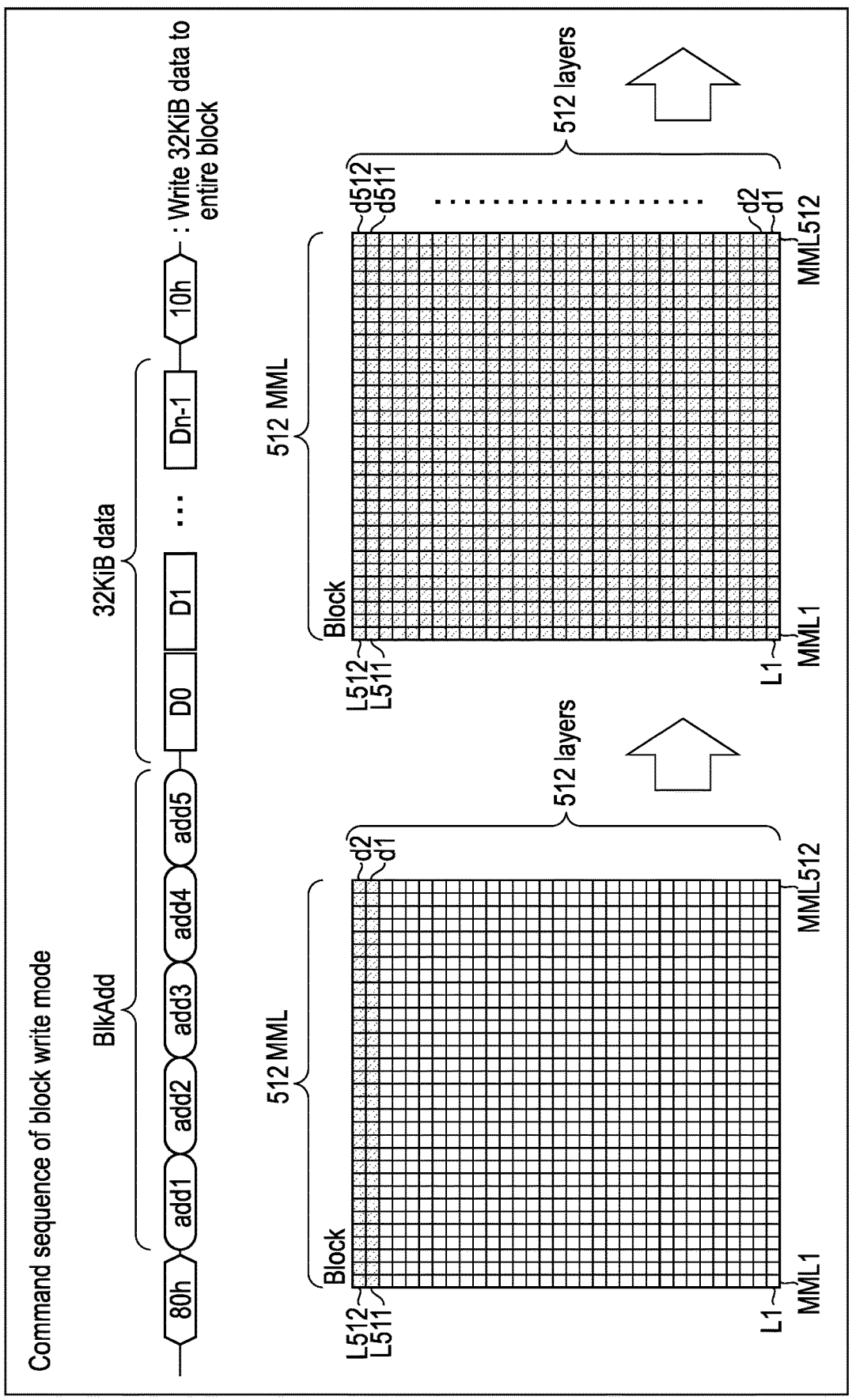
FIG. 7B is a diagram illustrating a remaining part of the block write operation of writing data of a block size to the entire block of the shift resister memory.

FIG. 7A is a diagram illustrating a part of the block write operation of writing the data of a block size to an entire block of the shift resister memory 3. FIG. 7B is a diagram illustrating a remaining part of the block write operation. To make the embodiments easily understood, it is assumed below that the shift register memory 3 is implemented by a magnetic domain wall memory and a block of the shift register memory 3 is composed of 512MML×512 layers. In this case, the capacity of the block is 32 KiB. In the block write operation, 32 KiB data are written to the entire block.

Incidentally, one block may comprise a configuration of 512MML×(512+α) layers. In this case, the capacity of the block is 32 KiB+α'. In the block write operation, the data having a size of 32 KiB+α', for example, a set of eight ECC frames is written to the entire block. Each of eight ECC frames includes the data having a size of 4 KiB and ECC having a size of α'/8.

When the write data of a block size (in this example, 32 KiB) is stored in the data buffer 25, the memory controller 2 transmits a write command sequence for the block write mode to the shift register memory 3 as illustrated in FIG. 7A, and thereby instructs the shift register memory 3 to write the data of a block size.

The write command sequence is a command sequence which specifies the block write mode, including, for example, a command cycle of transferring a command 80h, an address cycle, a data input cycle of transferring the write data of 32 KiB, and a command cycle of transferring a command 10h. Each of the command 80h and the command 10h is a command having a size of 1 byte. A symbol "h" subsequent to a number of two digits is indicative of that the number of two digits is represented by hexadecimal notation.

The command 80h is a command to declare the start of input of a write destination address. A block address (BlkAdd) of the block to which the data are to be written is specified by address cycles (in this example, five address cycles) subsequent to the command 80h. The block address is an identifier for identifying a specific block. The block address may be specified by, for example, a chip number, a plane number, and a block number in the plane. The write data of 32 KiB is transferred to the shift register memory 3 as the input data (write data) by a data input cycle subsequent to the address cycle.

The command 10h is a command to instruct the shift register memory 3 to execute the write operation. When the command 10h is input to the shift register memory 3 after the command 80h, the address cycle, and the data input cycle, the shift register memory 3 starts the block write operation of the block specified by the address cycle.

In the following descriptions, the write command sequence for specifying the block write mode is also referred to as 80h-BlkAdd-Data(32 KiB)-10h. In the block write operation, the shift register memory 3 writes the data having a block size to a plurality of layers in each of 512 magnetic memory lines MMLs (MML1 to MML512). More specifically, the following operations are executed.

In the shift register memory 3, data d1 of first 512 bits, of the write data of 32 KiB, is set in the input/output unit group 31 (or the input unit group 31a), and then a current pulse for downwardly shifting the data stored in each layer by one layer is supplied to each of 512 magnetic memory lines MMLs (MML1 to MML512). Thus, the write operation including both an operation of inputting the data from the input/output unit group 31 (or the input unit group 31a) to the starting layer of each of 512 magnetic memory lines MMLs (MML1 to MML512) and an operation of downwardly shifting the data stored in each layer of each of 512 magnetic memory lines MMLs (MML1 to MML512) by one layer is executed. Since the valid data does not exist in each MML, the only operation of inputting the data from the input/output unit group 31 (or the input unit group 31a) to a starting layer of each of 512 magnetic memory lines MMLs (MML1 to MML512) (in this example, the layer L512 of each MML) is executed. As a result, data d1 is written to the layer L512 of the write destination block as illustrated in FIG. 7A.

Next, in the shift register memory 3, data d2 of next 512 bits, of the write data of 32 KiB, is set in the input/output unit group 31 (or the input unit group 31a), and then a current pulse for downwardly shifting the data stored in each layer by one layer is supplied to each of 512 magnetic memory lines MMLs (MML1 to MML512). Thus, the write operation including both an operation of inputting the data from the input/output unit group 31 (or the input unit group 31a) to the starting layer of each of 512 magnetic memory lines MMLs (MML1 to MML512) and an operation of downwardly shifting the data stored in each layer of each of 512 magnetic memory lines MMLs (MML1 to MML512) by one layer is executed. As a result, the data d2 is written to the layer L512 of the write destination block and, simultaneously, the data d1 is shifted from the layer L512 to the layer 511 as illustrated in the left part of FIG. 7B.

Similarly, the write operation including both an operation of inputting the data to the starting layer of each of 512 magnetic memory lines MMLs (MML1 to MML512) (in this example, the layer L512 of each MML) and an operation of downwardly shifting the data stored in each layer of each of 512 magnetic memory lines MMLs (MML1 to MML512) by one layer is executed repeatedly. Then, 32 KiB write data are finally written to the entire block as illustrated in the right part of FIG. 7B. In this case, the data d1, data d2, . . . , data d511, and data d512 constituting 32 KiB write data are stored in the layers L1, L2, . . . , layer L511, and layer L512 of the block, respectively.

Incidentally, the host often requests the storage device to write, for example, data of a small size such as 4 KiB. For this reason, in the memory system 1 comprising the shift register memory 3, too, implementation of a new write mode capable of, quickly and persistently, storing the data of a smaller size than the block size is desired in addition to the write mode (block write mode) of executing the write operation in a unit of data of a block size.

The write mode capable of, quickly and persistently, storing the data of a smaller size in the shift register memory 3 can also be used in a case of persistently storing system data which are managed inside the memory system 1. Various management information handled by the memory controller 2 for data management, block management, and the like is included in the system data managed inside the memory system 1. One of examples of the system data is information of identifying the block to which the data is being written in addition to the mapping information managed by LUT.

Next, the operation of writing the data having a size smaller than the block size to the block of the shift register memory 3 will be described. The operation of writing the data having a size smaller than the block size to the block is also referred to as "partial write operation" or "write operation using a partial write mode".

The memory controller 2 can control the shift register memory 3 by selectively using the first write mode (block write mode) and the second write mode (partial write mode). For example, when the data having a 4 KiB size is requested to be persistently stored by the host 4 or when the system data handled by the memory controller 2 needs to be persistently stored, the memory controller 2 may transmit a write command sequence for specifying the second write mode (partial write mode) to the shift register memory 3 as needed.

Figure 8A:
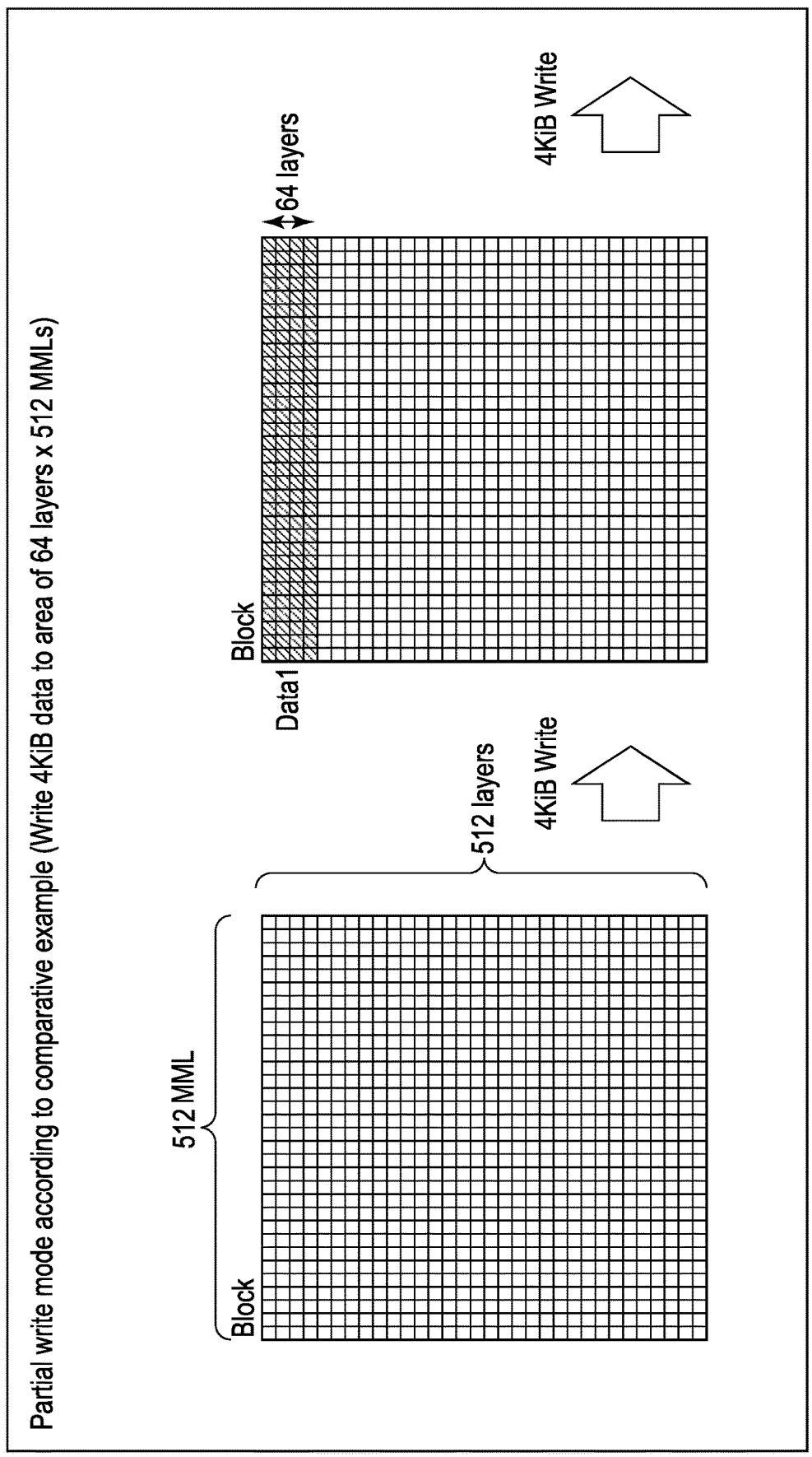
FIG. 8A is a diagram illustrating a part of a partial write operation according to a comparative example.
Figure 8B:
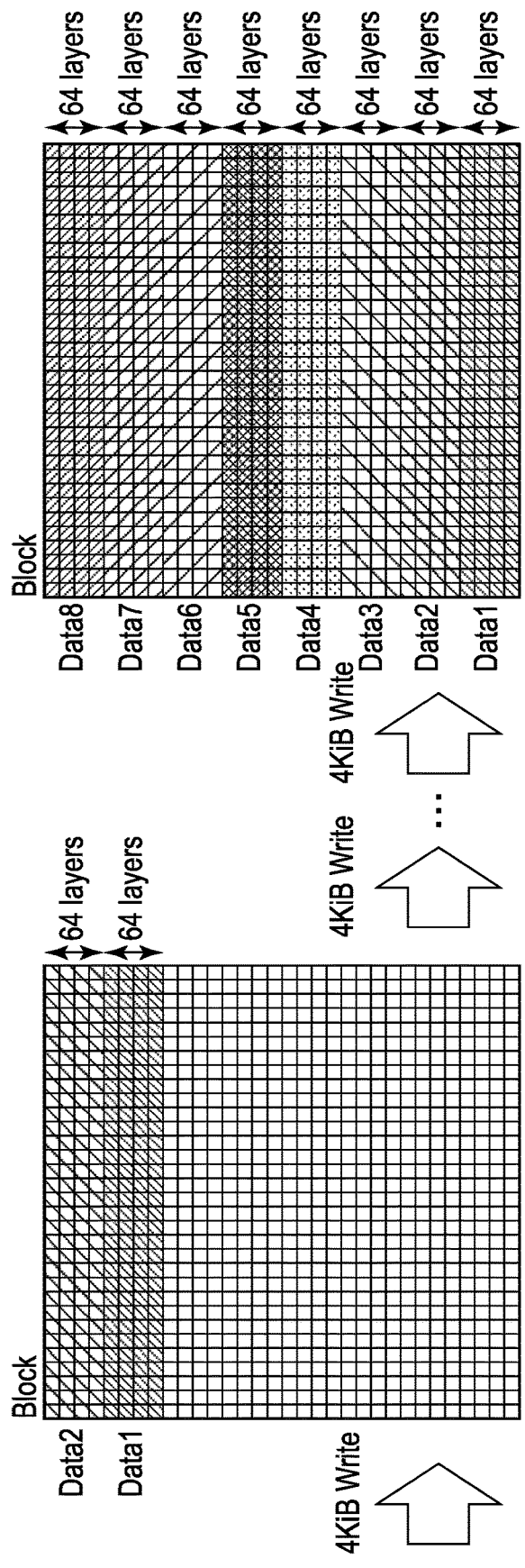
FIG. 8B is a diagram illustrating a remaining part of the partial write operation according to the comparative example.

First, a partial write operation according to a comparative example will be described. FIG. 8A is a diagram illustrating a part of a partial write operation according to the comparative example. FIG. 8B is a diagram illustrating a remaining part of the partial write operation according to the comparative example.

In the partial write operation according to the comparative example, 4 KiB data are written to an area of 64 layers×512 MMLs in the block having a configuration of 512 MMLs× 512 layers.

When the write command sequence for writing the data (Data1) having a 4 KiB size is input from the memory controller 2 to the shift register memory 3, the shift operation is executed at 64 times for all of 512 magnetic memory lines MMLs and the data (Data1) are written to 64 layers including the uppermost layer of the write destination block, i.e., the area of 64 layers×512 MMLs as illustrated in FIG. 8A.

In a case where a combination of the magnetization directions of the magnetization of two adjacent layers in each MML is used as the information indicative of "1" or "0", one-layer data written to the uppermost layer needs to be stored in a data storage area such as a latch circuit (or cache) in the shift register memory 3 to prepare for writing next 4 KiB data.

When the write command sequence for writing the data (Data2) having a 4 KiB size is input from the memory controller 2 to the shift register memory 3, the shift operation is executed at 64 times for all of 512 magnetic memory lines MMLs as illustrated in a left part of FIG. 8B. Thus, the data (Data2) are written to 64 layers including the uppermost layer of the write destination block, i.e., the area of 64 layers×512 MMLs and, simultaneously, the data (Data1) are shifted from 64 layers including the uppermost layer to 64 layers located on its lower layer side.

Then, when the operation of writing 4 KiB data to the area of 64 layers×512 MMLs is executed at eight times, the data (Data1) having a size of 4 KiB are stored in 64 lowermost layers in the write destination block, the data (Data2) having a size of 4 KiB are stored in 64 second lowermost layers from below in the write destination block, . . . , the data (Data7) having a size of 4 KiB are stored in 64 second uppermost layers from above in the lock of the write destination block, and the data (Data8) having a size of 4 KiB are stored in 64 uppermost layers in the write destination block, as illustrated in the right part of FIG. 8.

In this state, when certain 4 KiB data need to be read, the shift operation for all of 512 magnetic memory lines MMLs needs to be repeated at many times until 4 KiB data of the read target are read from the block. Furthermore, to write back 4 KiB data read from the block, to this block, the shift operation for all of 512 magnetic memory lines MMLs needs to be repeated at many times.

It is assumed here that, for example, in the FILO type magnetic domain wall memory, the data of the read target are 4 KiB data (Data1) illustrated in the right part of FIG. 8B. In this case, to read 4 KiB data of the read target, all of the other 4 KiB data that are not the read targets need to be read. For this reason, the shift operation for all of 512 magnetic memory lines MMLs needs to be executed at 512 times by supplying the shift current to all of 512 magnetic memory lines MMLs at 512 times.

Thus, when any 4 KiB data in the block are to be read, the shift operation needs to be repeated for all of 512 magnetic memory lines MMLs. Therefore, every time certain 4 KiB data are read from the block, the number of times of shift for each of 512 magnetic memory lines MMLs increases by an integral multiple of at least 64.

For example, when the memory controller 2 requests the 4 KiB data (Data2) to be read from the block after the 4 KiB data (Data1) are read and all of the data are written back to the block, the shift operation for all of 512 magnetic memory lines MMLs needs to be executed at 448 times by supplying the shift current to all of 512 magnetic memory lines MMLs at 448 times, in order to read the 4 KiB data (Data2) of the read target.

Therefore, the number times of shift for each of 512 magnetic memory lines MMLs is 960 (=512+448) in consideration of the number of times of shift necessary to read the Data1 and the Data2.

In general, as the number of times of the shift operations for each of the magnetic memory lines MMLs increases, the degree of wear of the MTJ element connected to each magnetic memory line MML becomes larger. For this reason, in general, the number of times of the shift operations which can be executed for each of the magnetic memory lines MMLs is limited to a certain maximum number of times of shift.

When each 4 KiB data is written to the block with the partial write operation according to the comparative example, the shift operation for all of 512 magnetic memory lines MMLs needs to be repeated at a number of times even if specific 4 KiB data needs to be read, as described above. For this reason, the write operation according to the comparative example causes increase in the number of times of shift for each of all magnetic memory lines MMLs in the block. Thus, since the number of times of shift for each of magnetic memory lines MMLs in the block can easily reach the maximum number of times of shift, quickly, the partial write operation according to the comparative example is a factor to increase the degree of wear of the block.

Figure 9A:
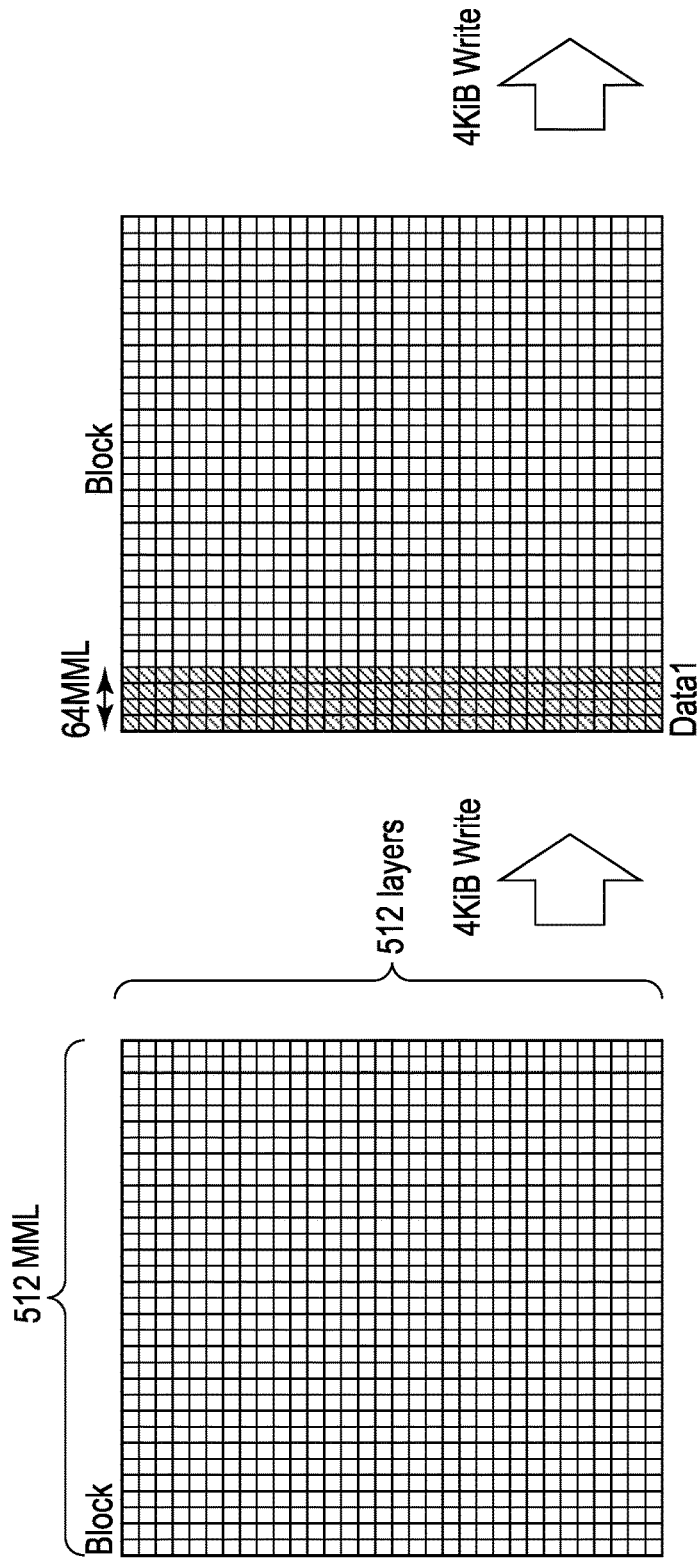
FIG. 9A is a diagram illustrating a part of the partial write operation executed in the memory system according to the first embodiment.
Figure 9B:
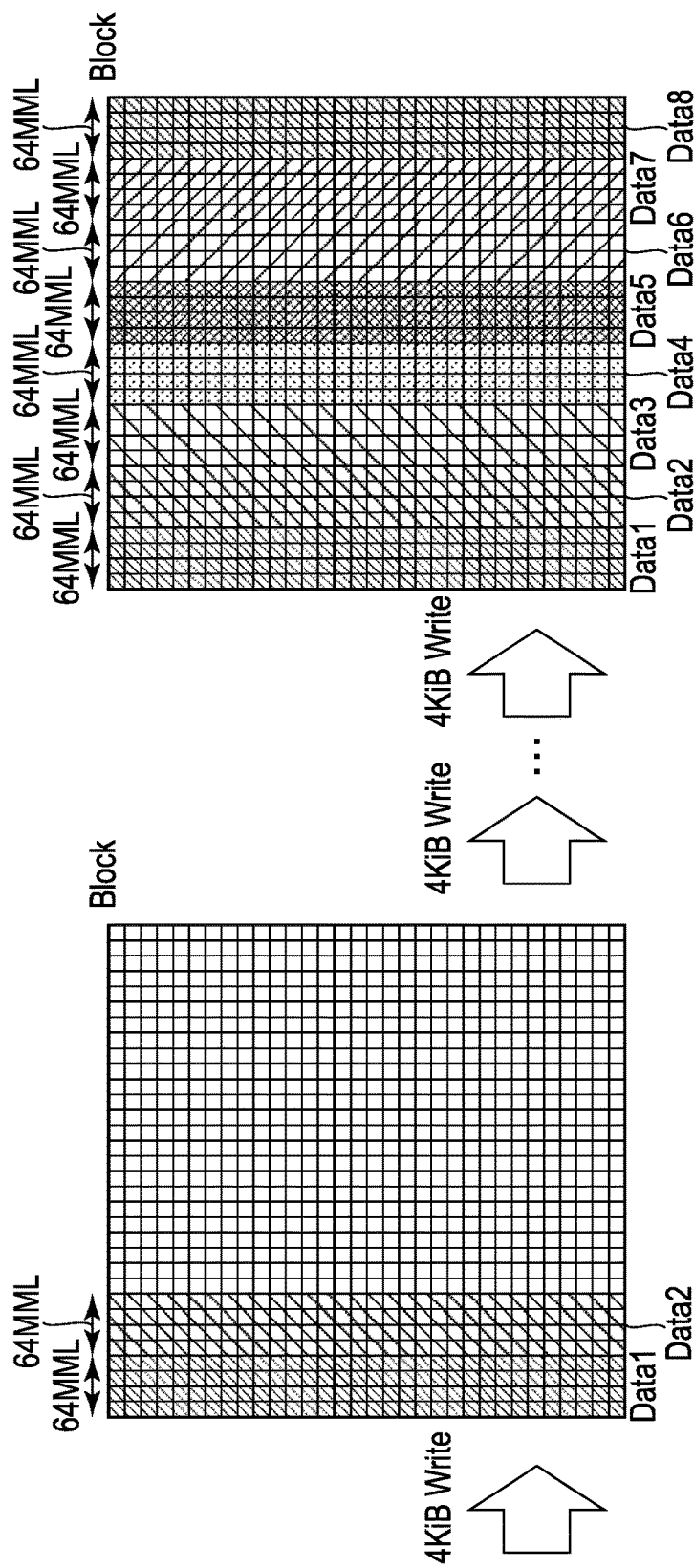
FIG. 9B is a diagram illustrating a remaining part of the partial write operation executed in the memory system according to the first embodiment.

Next, the partial write operation of the first embodiment will be described. FIG. 9A is a diagram illustrating a part of the partial write operation, which is executed in the memory system 1 according to the first embodiment. FIG. 9B is a diagram illustrating a remaining part of the partial write operation, which is executed in the memory system 1 according to the first embodiment.

In the partial write operation of the first embodiment, the shift register memory 3 writes the data having a size smaller than the block size to 512 layers of one or more specific magnetic memory lines MMLs, of 512 magnetic memory lines MMLs in the block, without writing the data to each of the other magnetic memory lines MMLs except the one or more specific magnetic memory lines MMLs.

More specifically, the shift register memory 3 executes the write operation, at a plurality of times (in this example, 512 times), including both the operation of inputting the data to the starting layer of each of the one or more specific magnetic memory lines MMLs and the operation of downwardly shifting the data stored in each layer of each of the one or more specific magnetic memory lines MMLs by one layer, without executing input of the data to each of the other magnetic memory lines MMLs except the one or more specific magnetic memory lines MMLs and shift of the data stored in each of the layers of each of the other magnetic memory lines MMLs. The shift register memory 3 thereby writes the data having a size smaller than the block size to one or more specific magnetic memory lines MMLs alone.

For example, 512 magnetic memory lines MMLs in the block are divided into eight groups (i.e., eight MML groups) each including 64 magnetic memory lines MMLs. Then, a shift current is supplied only to each of 64 magnetic memory lines MMLs included in a specific MML group. 4 KiB data are thereby written to 64 magnetic memory lines MMLs included in the specific MML group, in a state in which input of the data to each of the other MMLs and shift of the data stored in each layer of each of the other MMLs are prohibited.

That is, in the partial write operation of the first embodiment, the operation of supplying the shift current only to each of 64 magnetic memory lines MMLs included in the specific MML group is repeated, and 4 KiB data are thereby written to the area of 512 layers×64 MMLs.

When the write command sequence for writing the data (Data1) having a size of 4 KiB in the partial write mode is input from the memory controller 2 to the shift register memory 3, the shift register memory 3 executes the write operation, at 512 times, including both the operation of inputting the data to the starting layer of each of 64 magnetic memory lines MMLs included in the write target MML group in the write destination block and the operation of downwardly shifting the data stored in each layer of each of 64 magnetic memory lines MMLs by one layer. As illustrated in FIG. 9A, 4 KiB data (Data1) are thereby written to 64 magnetic memory lines MMLs included in the write target MML group, i.e., the area of 512 layers×64 MMLs.

The data are thereby stored in all layers included in 64 magnetic memory lines MMLs included in the writ target MML group. Therefore, further writing the data to the 64 magnetic memory lines MMLs is not executed. Therefore, even in a case where a combination of the magnetization directions of the magnetizations of two adjacent layers in each MML is used as the information indicative of "1" or "0", 64-bit data written to the starting layer (uppermost layer) of 64 magnetic memory lines MMLs do not need to be stored in a data storage area such as a latch circuit (or cache) in the shift register memory 3.

When the write command sequence for writing the data (Data2) having a size of 4 KiB in the partial write mode is input from the memory controller 2 to the shift register memory 3, the shift register memory 3 executes the write operation, at 512 times, including both the operation of inputting the data to the starting layer of 64 magnetic memory lines MMLs included in a next write target MML group in the write destination block and the operation of downwardly shifting the data stored in each layer of each of 64 magnetic memory lines MMLs by one layer. As illustrated in the left part of FIG. 9B, data (Data2) are thereby written to 64 magnetic memory lines MMLs included in the next write target MML group, i.e., the area of 512 layers×64 MMLs.

The data are thereby stored in all layers included in 64 magnetic memory lines MMLs included in the next write target MML group. Therefore, further writing the data to the 64 magnetic memory lines MMLs is not executed. Therefore, even in a case where a combination of the magnetization directions of the magnetizations of two adjacent layers in each MML is used as the information indicative of "1" or "0", 64-bit data written to the starting layer in 64 magnetic memory lines MMLs do not need to be stored in a data storage area such as a latch circuit (or cache) in the shift register memory 3.

Then, when the operation of writing 4 KiB data to the area of 512 layers×64 MMLs is thus executed at eight times, the data (Data1) having a size of 4 KiB are stored in 512 layers of 64 magnetic memory lines MMLs included in the first MML group in the write destination block, the data (Data2) having a size of 4 KiB are stored in 512 layers of 64 magnetic memory lines MMLs included in the second MML group in the write destination block, . . . , the data (Data7) having a size of 4 KiB are stored in 512 layers of 64 magnetic memory lines MMLs included in the seventh MML group in the write destination block, and the data (Data8) having a size of 4 KiB are stored in 512 layers of 64 magnetic memory lines MMLs included in the eighth MML group in the write destination block, as illustrated in the right part of FIG. 9B.

In this state, when certain 4 KiB data need to be read, only 4 KiB data of the read target can be read from the block by only repeating the shift operation for not all of 512 magnetic memory lines MMLs, but 64 magnetic memory lines MMLs in which 4 KiB data of the read target are stored.

For example, in the FILO type magnetic domain wall memory, when the read target data are the data (Data1) illustrated in the right part of FIG. 9B, the only data (Data1) can be read from the block by only supplying the shift current to each of 64 magnetic memory lines MMLs included in the first MML group at 512 times. The shift operation for each of the other magnetic memory lines MMLs does not need to be executed.

Similarly, when the read target data are the data (Data8) illustrated in the right part of FIG. 9B, the only data (Data8) can be read from the block by only supplying the shift current to each of 64 magnetic memory lines MMLs included in the eighth MML group at 512 times. The shift operation for each of the other magnetic memory lines MMLs does not need to be executed.

Thus, when the partial write operation of the first embodiment is used, 4 KiB data are written to 512 layers of 64 specific magnetic memory lines MMLs. Therefore, 4 KiB data of the read target can be read from the block by executing the only shift operation for 64 specific magnetic memory lines MMLs in which the 4 KiB data of the read target are stored. The shift operation for each of the other magnetic memory lines MMLs does not need to be executed.

For example, it is assumed here that reading the 4 KiB data (Data1) from the block, writing back the read Data1 to the block, and reading the 4 KiB data (Data2) from the block are requested by the memory controller 2. The 4 KiB data (Data2) can be read from the block by only supplying the shift current to each of 64 magnetic memory lines MMLs included in the second MML group at 512 times.

Therefore, in consideration of the number of times of shift necessary to read the Data1 and the Data2, the number of times of shift of each of 64 magnetic memory lines MMLs included in the starting MML group is 512 and, similarly, the number of times of shift of each of 64 magnetic memory lines MMLs included in the second MML group is also 512. The number of times of shift of each of the magnetic memory lines MMLs included in each of the other specific MML groups is zero.

Therefore, when the partial write operation of the first embodiment is used, writing and reading the 4 KiB data can be executed by a plurality of shift operations for the minimum necessary number of magnetic memory lines MMLs required for writing and reading the 4 KiB data.

Therefore, the number of times of the shift operations executed for each of the magnetic memory lines MMLs in the block can be reduced to the minimum necessary number of times, and increase in the degree of wear of each of the magnetic memory lines MMLs in the block can be suppressed to be minimum necessary level, as compared with the partial write operation of the comparative example.

Furthermore, when the partial write operation of the first embodiment is used, the only 4 KiB data of the read target can be read from the block without reading 4 KiB data other than the 4 KiB data of the read target from the block. Therefore, the only 4 KiB data of the read target that are read from the block need to be written back to the block as needed, and the data other than the 4 KiB data of the read target do not need to be written back to the block. Thus, when the partial write operation of the first embodiment is used, the number of times of shift operations required to write back the data can also be reduced to the necessary minimum number of times.

Figure 10:
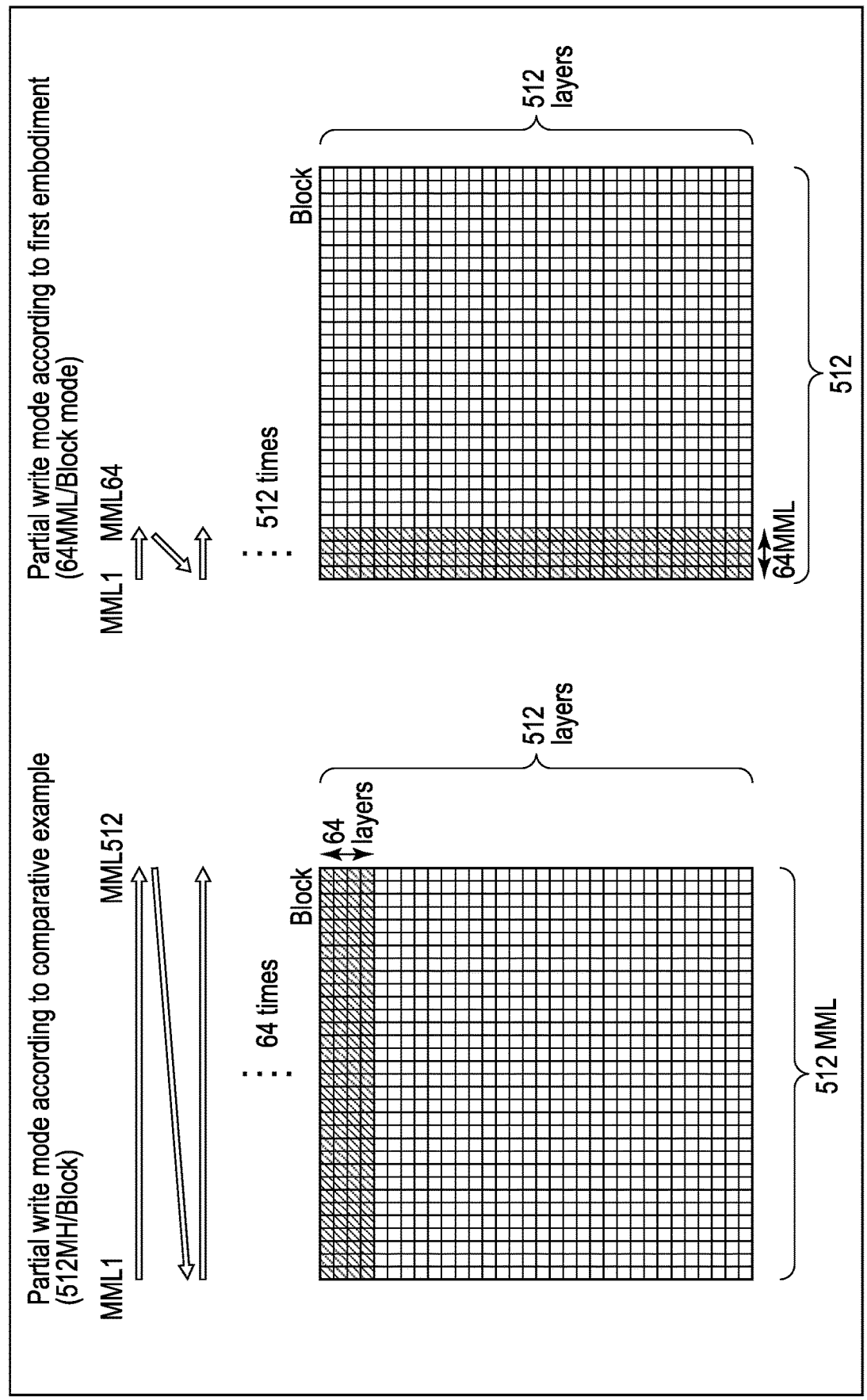
FIG. 10 is a diagram illustrating a difference between a data write order in the partial write operation according to the comparative example and a data write order in the partial write operation according to the first embodiment.

FIG. 10 is a diagram illustrating a difference between a data write order in the partial write operation according to the comparative example and a data write order in the partial write operation according to the first embodiment.

In the partial write operation according to the comparative example, as illustrated in the left part of FIG. 10, the write operation including both the operation of inputting the data to each of 512 magnetic memory lines MMLs in the block and the operation of downwardly shifting the data stored in each layer of each of 512 magnetic memory lines MMLs by one layer is repeated at 64 times. The 4 KiB data are thereby written to the area of 64 layers×512 MMLs. The number of times of shift necessary to be executed for each of 512 magnetic memory lines MMLs to read the 4 KiB data stored in 64 layers including the uppermost layer of the block is 64. The number of times of shift necessary to be executed for each of 512 magnetic memory lines MMLs to read the 4 KiB data stored in 64 layers including the lowermost layer of the block is 512.

In contrast, in the partial write operation according to the first embodiment, as illustrated in the right part of FIG. 10, the write operation including both the operation of inputting the data to each of 64 magnetic memory lines MMLs included in one MML group in the block and the operation of downwardly shifting the data stored in each layer of each of these 64 magnetic memory lines MMLs by one layer is repeated at 512 times. The 4 KiB data are thereby written to the area of 512 layers×64 MMLs. Therefore, in any MML group, the number of times of shift necessary to be executed for each of 64 magnetic memory lines MMLs to read the 4 KiB data is 512.

The shift operations for a plurality of magnetic memory lines MMLs in the same block can be executed in parallel. Therefore, as the number of times of shift necessary to be executed for each of the magnetic memory lines MMLs to read the 4 KiB data increases, the time required to read the 4 KiB data becomes longer. In the partial write operation according to the first embodiment, the time required to read the 4 KiB data written to the area of 512 layers×64 MMLs is the same as the time required to read the 4 KiB data stored in 64 layers including the lowermost layer of the block.

In the above descriptions, the case where the number of magnetic memory lines MMLs to which the data are written by the partial write operation in the block of 512 layer×512 MMLs is 64 has been exemplified. However, the number of magnetic memory lines MMLs to which the data are written by the partial write operation is not limited to 64, but may be one or more and less than 512.

For example, when the size of the data to be written to the block by the partial write operation is 2 KiB, 2 KiB data may be written to the area of 512 layers×32 MMLs. In addition, for example, when the size of the data to be written to the block by the partial write operation is 1 KiB, 1 KiB data may be written to the area of 512 layers×16 MMLs.

Figure 11:
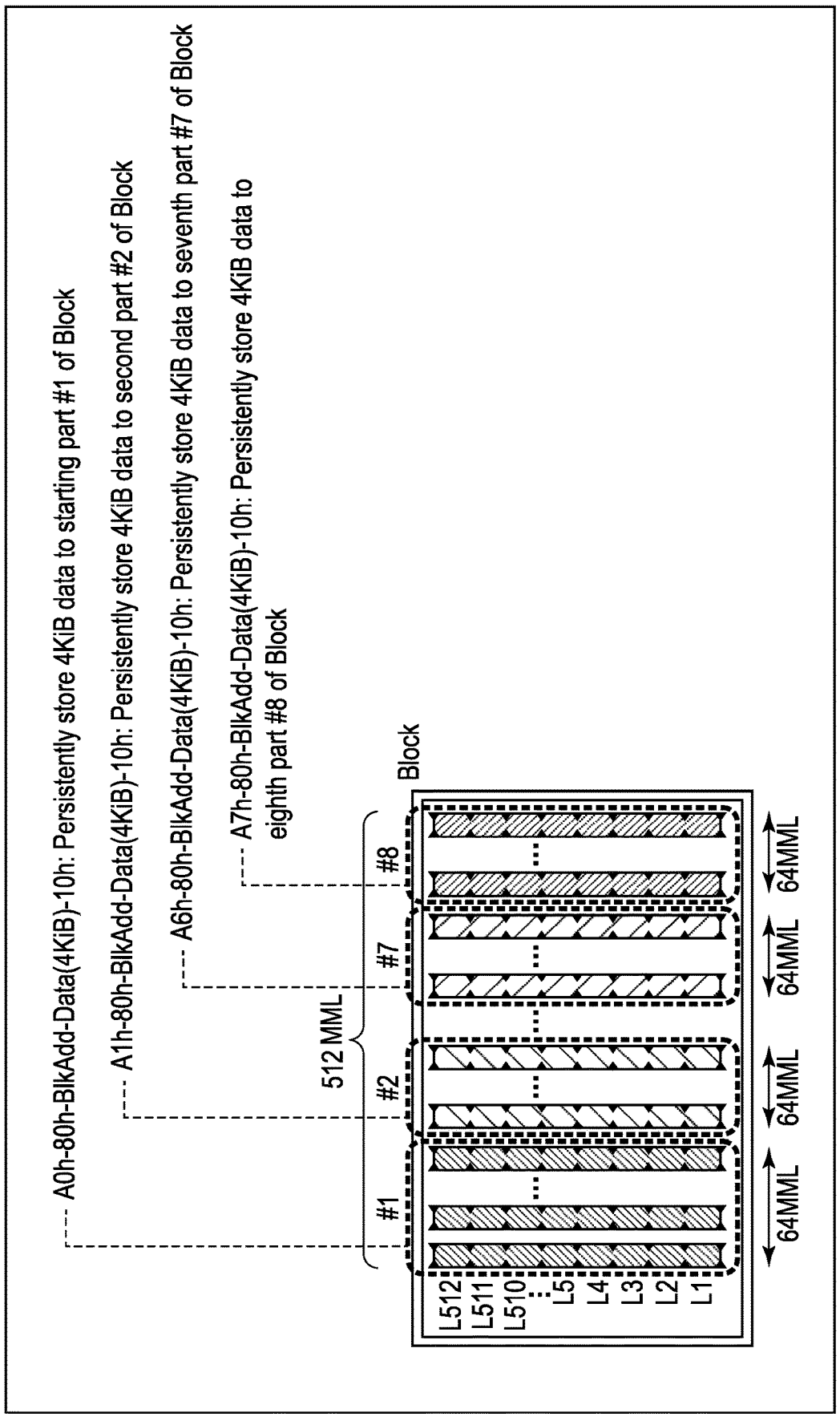
FIG. 11 is a diagram illustrating an example of a command sequence to implement the partial write operation executed in the memory system according to the first embodiment.

FIG. 11 is a diagram illustrating an example of a command sequence to implement the partial write operation according to the first embodiment.

As illustrated in FIG. 11, the memory controller 2 transmits a write command sequence for the partial write mode to the shift register memory 3 and thereby instructs the shift register memory 3 to write the data of a size smaller than the block size.

The write command sequence is a command sequence specifying the partial write mode and is implemented by, for example, adding command AXh to the front of starting command 80h of the write command sequence (80h-BlkAdd-Data(32 KiB)-10h) specifying the block write mode illustrated in FIG. 7A.

The command AXh is a command having a size of 1 byte. A symbol "h" subsequent to a number of two digits is indicative of that the number of two digits is represented by hexadecimal notation.

The command AXh functions as a command code specifying, as a write destination location, one of eight MML groups obtained by logically dividing 512 magnetic memory lines MMLs. Each of the MML groups includes 64 magnetic memory lines MMLs.

For example, command A0h specifies starting part #1 of the block (i.e., starting MML group #1) as the write destination location. The command sequence (A0h-80h-BlkAdd-Data(4 KiB)-10h) is used as a write command sequence which specifies the partial write mode and which specifies persistently storing the 4 KiB data in the starting part #1 of the block (i.e., starting MML group #1). BlkAdd is indicative of a block address of the write destination block, similarly to the block write mode. Data (4 KiB) is indicative of a data input cycle of transferring the 4 KiB data from the memory controller 2 to the shift register memory 3. When the command 10h is input to the shift register memory 3 after the command A0h, the command 80h, the address cycle, and the data input cycle are input to the shift register memory 3, the shift register memory 3 starts the partial write operation of the block specified by the address cycle.

The command A1h specifies second part #2 of the block (i.e., MML group #2) as the write destination location. For this reason, the command sequence (A1h-80h-BlkAdd-Data(4 KiB)-10h) is used as a write command sequence which specifies the partial write mode and which specifies persistently storing the 4 KiB data in the second part #2 of the block (i.e., MML group #2). BlkAdd is indicative of a block address of the write destination block.

Similarly, the command A6h specifies seventh part #7 of the block (i.e., MML group #7) as the write destination location. For this reason, the command sequence (A6h-80h-BlkAdd-Data(4 KiB)-10h) is used as a write command sequence which specifies the partial write mode and which specifies persistently storing the 4 KiB data in the seventh part #7 of the block (i.e., MML group #7). BlkAdd is indicative of a block address of the write destination block.

Then, the command A7h specifies eighth part #8 of the block (i.e., MML group #8) as the write destination location. For this reason, the command sequence (A7h-80h-BlkAdd-Data(4 KiB)-10h) is used as a write command sequence which specifies the partial write mode and which specifies persistently storing the 4 KiB data in the eighth part #8 of the block (i.e., MML group #8). BlkAdd is indicative of a block address of the write destination block.

For example, when receiving command sequence (A1h-80h-BlkAdd-Data(4 KiB)-10h) from the memory controller 2, the shift register memory 3 selects 64 magnetic memory lines MMLs included in the MML group #1 from 512 magnetic memory lines MMLs included in the write destination block specified by BlkAdd. Then, the shift register memory 3 writes the 4 KiB data received from the memory controller 2, to 512 layers included in 64 selected magnetic memory lines MMLs, i.e., to 512 layers×64 MMLs.

More specifically, in the shift register memory 3, first 64-bit data of the 4 KiB data from the memory controller 2 are first set in 64 input/output units (or 64 input units) corresponding to 64 magnetic memory lines MMLs included in the MML group #1, and then a current pulse for downwardly shifting the data stored in each layer by one layer is supplied to each of 64 magnetic memory lines MMLs but the current pulse is not supplied to each of the other magnetic memory lines MMLs.

Thus, the write operation including both an operation of inputting the data to the starting layer of each of 64 magnetic memory lines MMLs included in the MML group #1 (in this example, the layer L512 of each MML) and an operation of downwardly shifting the data stored in each layer of each of 64 magnetic memory lines MMLs by one layer is executed. When writing the first 64-bit data to 64 magnetic memory lines MMLs, since the valid data does not exist in each of 64 magnetic memory lines MMLs, the only operation of inputting the data to the starting layer of 64 magnetic memory lines MMLs (in this example, the layer L512 of each MML) is executed.

Next, in the shift register memory 3, next 64-bit data of the 4 KiB data from the memory controller 2 are set in 64 input/output units (or 64 input units) corresponding to 64 magnetic memory lines MMLs included in the MML group #1, and then a current pulse for downwardly shifting the data stored in each layer by one layer is supplied to each of 64 magnetic memory lines MMLs but the current pulse is not supplied to each of the other magnetic memory lines MMLs.

Thus, the write operation including both an operation of inputting the data to the starting layer of each of 64 magnetic memory lines MMLs included in the MML group #1 (in this example, the layer L512 of each MML) and an operation of downwardly shifting the data stored in each layer of each of 64 magnetic memory lines MMLs by one layer is executed. The next 64-bit data are input to the starting layer L512 of the MML group #1, and the first 64-bit data stored in the starting layer L512 of the MML group #1 are shifted from the layer L512 to the layer L511 of the MML group #1.

By executing the above write operation at a total of 512 times, the 4 KiB data from the memory controller 2 are written to 512 layers included in 64 magnetic memory lines MMLs included in the MML group #1, i.e., the area of 512 layers×64 MMLs.

Figure 12:
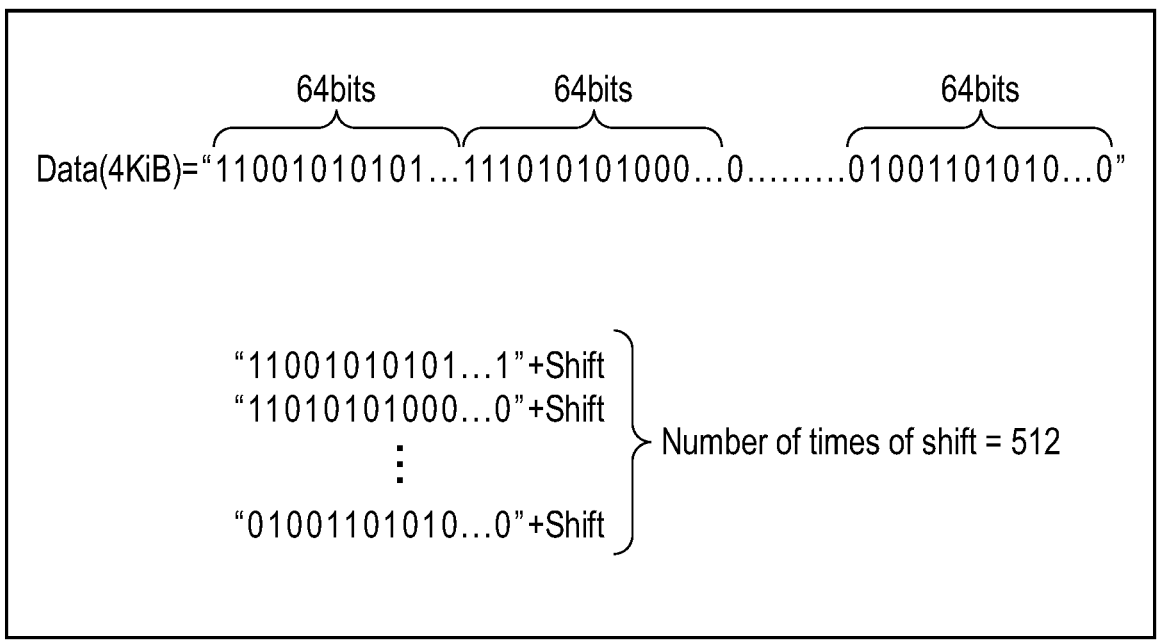
FIG. 12 is a diagram illustrating an operation of dividing input data into a plurality of data parts each having a 64-bit size, which is executed in the shift resister memory.

FIG. 12 is a diagram illustrating an operation of dividing 4 KiB data from the memory controller 2 into 512 data portions each having a size of 64 bits.

When receiving the command sequence (AXh-80h-BlkAdd-Data(4 KiB)-10h) from the memory controller 2, the shift register memory 3 divides the 4 KiB data into 512 data portions each including 64-bit data. Then, the shift register memory 3 sets first 64-bit data in 64 input/output units (or 64 input units) corresponding to 64 magnetic memory lines MMLs included in the write target MML group, and then supplies a current pulse for downwardly shifting the data stored in each layer by one layer to each of 64 magnetic memory lines MMLs.

Next, the shift register memory 3 sets second 64-bit data in 64 input/output units (or 64 input units) included in the write target MML group, and then supplies again the current pulse for downwardly shifting the data stored in each layer by one layer to each of 64 magnetic memory lines MMLs.

The same process is executed for third 64-bit data to 511th 64-bit data. Then, finally, the shift register memory 3 sets 512th 64-bit data in 64 input/output units (or 64 input units) corresponding to 64 magnetic memory lines MMLs included in the write target MML group, and then supplies a current pulse for downwardly shifting the data stored in each layer by one layer to each of 64 magnetic memory lines MMLs.

Thus, the 4 KiB data received from the memory controller 2 can be written to 512 layers included in 64 magnetic memory lines MMLs included in the MML group of the write target, i.e., the area of 512 layers×64 MMLs.

When the 4 KiB data written to a certain block by the partial write operation need to be read, the memory controller 2 may transmit, for example, the read command sequence (AXh-00h-BlkAdd-30h) to the shift register memory 3.

The command 00h is a command to declare the start of input of a read target address. A block address (BlkAdd) of the block from which the data are to be read is specified by address cycle subsequent to the command 00h. The command 30h is a command to instruct the shift register memory 3 to execute the read operation.

The command AXh specifies a read target location in the read target block. For example, A0h specifies the first MML group #1 of eight MML groups included in the read target block as the read target location. In addition, A1h specifies the second MML group #2 of eight MML groups included in the read target block as the read target location. Similarly, A7h specifies the eighth MML group #8 of eight MML groups included in the read target block as the read target location.

When the command 30h is input to the shift register memory 3 after the command AXh, the command 00h, and the address cycle are input to the shift register memory 3, the shift register memory 3 starts the read operation of reading the data stored in the MML group specified by the command AXh of eight MML groups included in the block specified by the address cycle. Then, the shift register memory 3 transmits the data read from the block to the memory controller 2 as output data (read data).

For example, when receiving read command sequence (A0h-00h-BlkAdd-30h or F0h-00h-BlkAdd-30h) from the memory controller 2, the shift register memory 3 supplies a shift current for reading only to each of 64 magnetic memory lines included in the MML group #1 in the read target block specified by BlkAdd, at 512 times, and thereby reads the only 4 KiB data stored in 64 magnetic memory lines included in the MML group #1 but does not read the data stored in each of the other magnetic memory lines in the read target block. Then, the shift register memory 3 transmits the 4 KiB data read from the read target block to the memory controller 2 as output data (read data).

Next, the partial write operation of writing the data to a multiple of 64 magnetic memory lines MMLs will be described with reference to FIG. 13.

(A) of FIG. 13 illustrates the partial write operation of writing the 4 KiB data to 512 layers of 64 magnetic memory lines MMLs, i.e., the area of 512 layers×64 MMLs. However, it is assumed that writing the data of a size larger than 4 KiB and smaller than the block size to the block needs to be executed. Therefore, as illustrated in (B) of FIG. 13, the memory system 1 of the first embodiment is configured to executed an expanded partial write operation of writing the data having a size of an integral multiple of the capacity (in this example, 4 KiB) of one MML group to 512 layers of each of X magnetic memory lines MMLs, i.e., the area of 512 layers×X MMLs.

In (B) of FIG. 13, the data (Data1) having a size of 4 KiB are written to a first area (corresponding to the MML group #1) of 512 layers×64 MMLs in the block having a configuration of 512 MMLs×512 layers. The data (Data2) having a size of 4 KiB are written to a next area (corresponding to the MML group #2) of 512 layers×64 MMLs in the block. The data (Data3) having a size of 8 KiB are written to an area (corresponding to the MML group #3 and the MML group #4) of 512 layers×128 MMLs in the block. The data (Data4) having a size of 16 KiB are written to an area (corresponding to the MML group #5 to MML group #8) of 512 layers×256 MMLs in the block.

To implement writing the data having a size of an integral multiple of 4 KiB by the write command sequence (AXh-80h-BlkAdd-Data-10h) specifying the partial write mode, the command AXh is used as a command specifying both a size and a write destination location of the data to be written to the block. The size of the data to be written to the block is an integral multiple of the capacity of each MML group. In the following descriptions, the command AXh is also referred to as an AX command or A command.

Figures 14, 15:
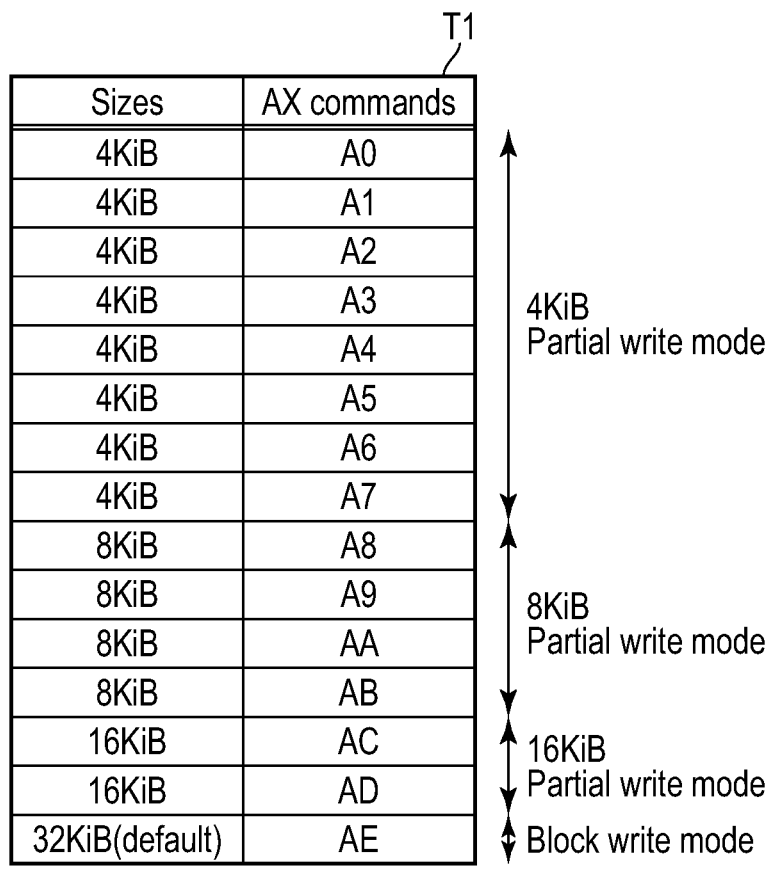
FIG. 14 is a diagram illustrating an example of a command table indicative of a relationship between each of AX commands and each of data sizes.
FIG. 15 is a diagram illustrating an example of a relationship between each of AX commands and each of write destination locations in block.

As illustrated in an AX command table T1 of FIG. 14, the size of 4 KiB is allocated to each of A0h to A7h. The size of 8 KiB is allocated to each of A8h, A9h, AAh, and ABh. The size of 16 KiB is allocated to each of ACh and ADh. The size of 32 KiB is allocated to AEh.

Furthermore, the command AXh specifies, as a write destination location, one or more MML groups of eight MML groups #1 to #8 obtained by logically dividing 512 magnetic memory lines MMLs in the block having a configuration of 512 MMLs×512 layers.

For example, as illustrated in a table of FIG. 15, the MML group #1 to MML group #8 are allocated as the write destination locations corresponding to A0h to A7h, respectively. Both the MML group #1 and the MML group #2 are allocated as the write destination locations corresponding to A8h. Both the MML group #3 and the MML group #4 are allocated as the write destination locations corresponding to A9h. Both the MML group #5 and the MML group #6 are allocated as the write destination locations corresponding to AAh. Both the MML group #7 and the MML group #8 are allocated as the write destination locations corresponding to ABh.

The MML group #1 to the MML group #4 are allocated as the write destination locations corresponding to ACh. The MML group #5 to the MML group #8 are allocated as the write destination locations corresponding to ADh. Then, the MML group #1 to the MML group #8 are allocated as the write destination locations corresponding to AEh.

The sequencer 34 of the shift register memory 3 stores contents of the AX command table T1 (or both the AX command table T1 and the table of FIG. 15) and can determine the data size to be written to the write destination block specified by BlkAdd and the write destination locations in the write destination block (i.e., one or more MML groups), based on the command AXh included in the write command sequence (AXh-80h-BlkAdd-Data-10h).

Figure 16:
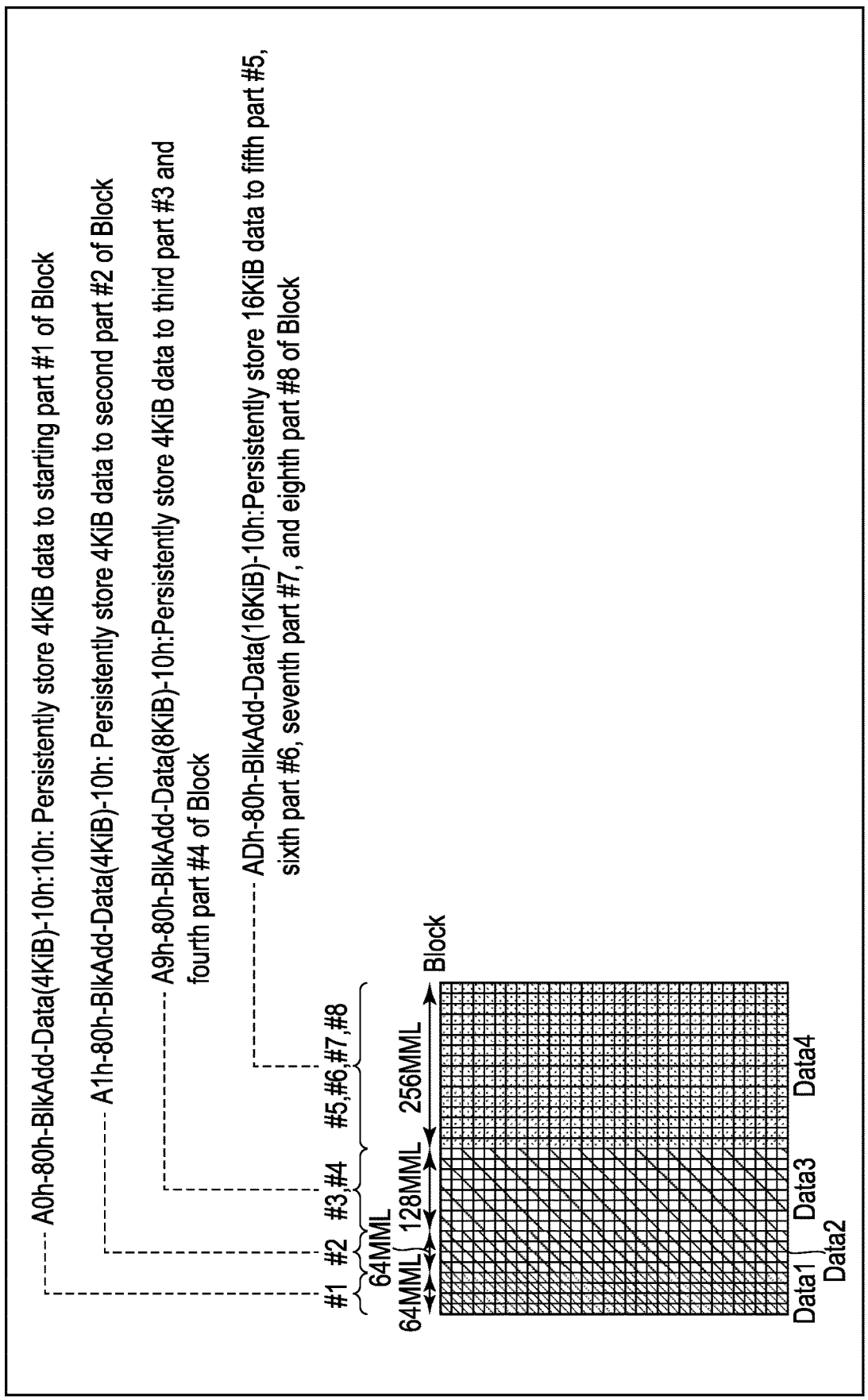
FIG. 16 is a diagram illustrating an example of several command sequences using the AX commands.

FIG. 16 is a diagram illustrating an example of several command sequences using the AX commands.

The command sequence (A0h-80h-BlkAdd-Data(4 KiB)-10h) is used as a write command sequence which specifies the partial write mode and which specifies persistently storing the 4 KiB data in the starting part #1 of the block (i.e., starting MML group #1).

The command sequence (A1h-80h-BlkAdd-Data(4 KiB)-10h) is used as a write command sequence which specifies the partial write mode and which specifies persistently storing the 4 KiB data in the second part #2 of the block (i.e., MML group #2).

The command sequence (A9h-80h-BlkAdd-Data(8 KiB)-10h) is used as a write command sequence which specifies the partial write mode and which specifies persistently storing the 8 KiB data in the third part #3 and the fourth part #4 of the block (i.e., MML groups #3 and #4).

The command sequence (ADh-80h-BlkAdd-Data(16 KiB)-10h) is used as a write command sequence which specifies the partial write mode and which specifies persistently storing the 16 KiB data in the fifth part #5 to the eighth part #8 of the block (i.e., MML groups #5 to #8).

Figure 17:
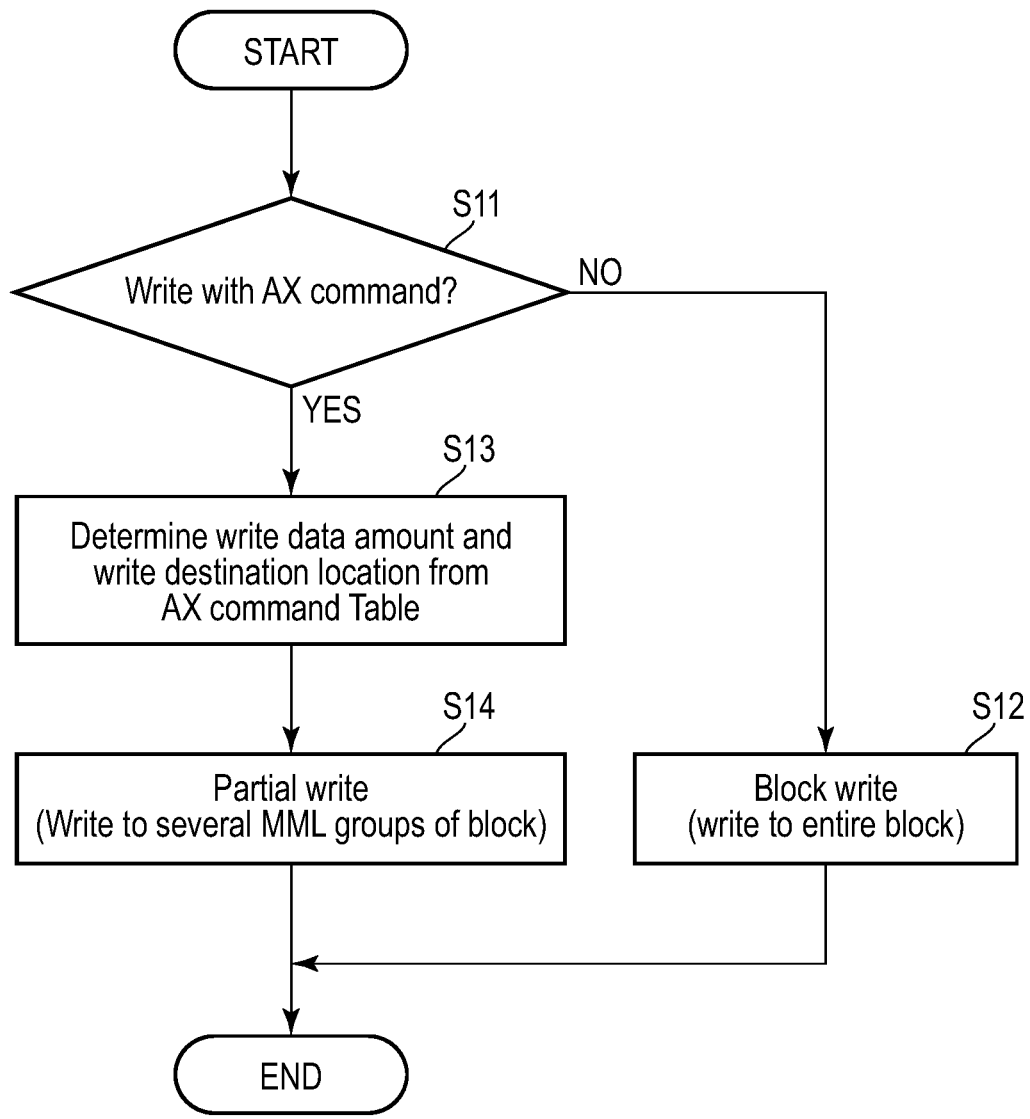
FIG. 17 is a flowchart illustrating a procedure of the write operation executed in the shift resister memory.

FIG. 17 is a flowchart illustrating a procedure of the write operation executed in the shift resister memory 3.

When receiving the write command sequence from the memory controller 2, the sequencer 34 of the shift register memory 3 determines whether the received write command sequence is a write command sequence including the AX command or not (step S11).

When the received write command sequence is a write command sequence which does not include the AX command (NO in step S11), the sequencer 34 determines that the received write command sequence is the write command sequence specifying the block write mode. Then, the sequencer 34 executes the block write operation (step S12). In step S12, the sequencer 34 writes the 32 KiB data, which are transferred from the memory controller 2 to the shift register memory 3, to the entire write destination block specified by BlkAdd in the write command sequence.

In contrast, when the received write command sequence is a write command sequence including the AX command (YES in step S11), the sequencer 34 determines that the received write command sequence is the write command sequence specifying the partial write mode.

In this case, the sequencer 34 first determines the size (i.e., write data amount) of the data to be written to the write destination block specified by BlkAdd in the write command sequence, and the write destination location in the write destination block (i.e., one or more write target MML groups of eight MML groups), by referring to the AX command table T1 based on the AX command in the write command sequence (step S14). Then, the sequencer 34 executes the partial write operation of writing the data of the determined size to 512 layers of a plurality of magnetic memory lines MMLs included in one or more determined write target MML groups (step S14).

Next, another write command sequence for the partial write mode will be described.

Using two commands (command BXh and command CXh) instead of the AX command is assumed below. The command obtained by adding two commands (command BXh and command CXh) to the front of the write command sequence (80h-BlkAdd-Data(32 KiB)-10h) specifying the block write mode is used as a write command sequence specifying the partial write mode.

The command BXh is used as a command code specifying a size of the data to be written to the block. The size of the data to be written to the block is an integral multiple of the capacity of each MML group.

The command CXh is used as a command code specifying the write destination location in the block. More specifically, the command CXh specifies the offset from the starting part of eight MML groups included in the block to the write start MML group, in a unit of data size indicated by the command BX combined with the command CXh. The one or more write target MML groups of eight MML groups are determined by a combination of the command BXh and the command CXh included in the same write command sequence. In the following descriptions, the command BXh is also referred to as a BX command or a B command, and the command CXh is also referred to as a CX command or a C command.

Figure 18:
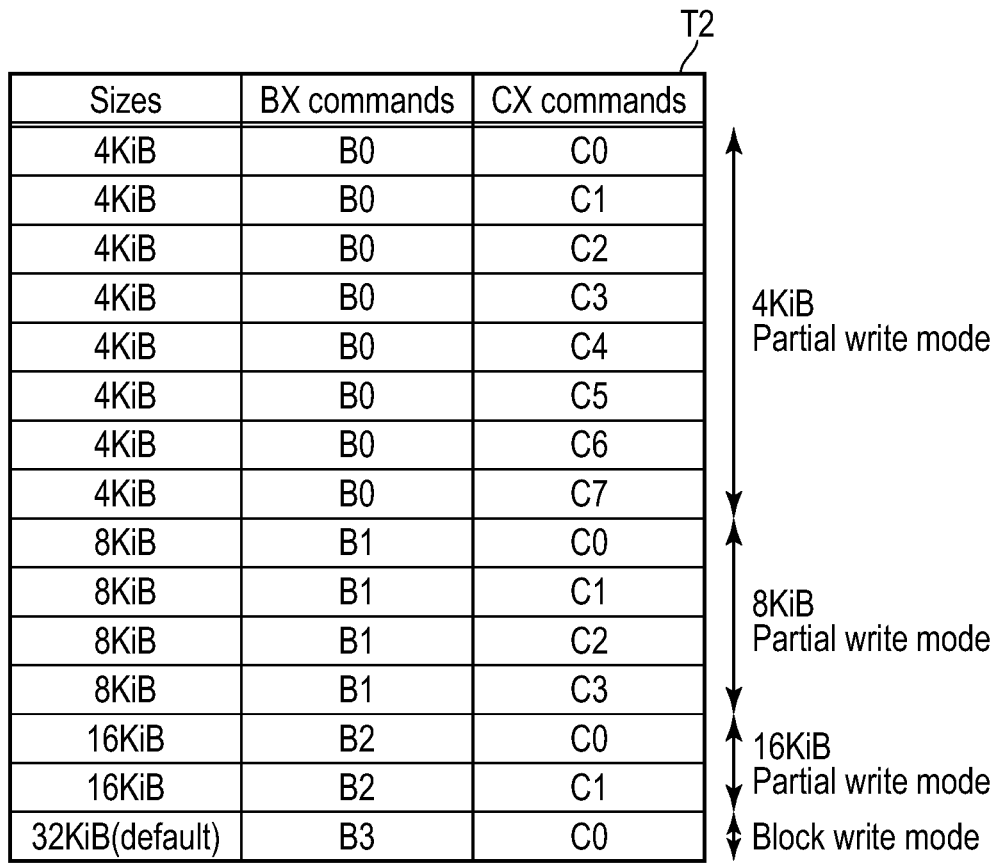
FIG. 18 is a diagram illustrating an example of a command table indicative of a relationship between each of BX commands and each of data sizes.

FIG. 18 is a diagram illustrating an example of a command table (BX command table) T2 indicative of a relationship between each of BX commands and each of data sizes. The size of 4 KiB is allocated to a command B0h. The command B0h can be combined with any one of commands C0h to C7h. The size of 8 KiB is allocated to a command B1h. The command B0h can be combined with any one of commands C0h to C7h. The size of 16 KiB is allocated to a command B2h. The command B2h can be combined with the command C0h or the command C1h. The size of 32 KiB is allocated to a command B3h. The command B3h can be combined with the command C0h alone.

Figure 19:
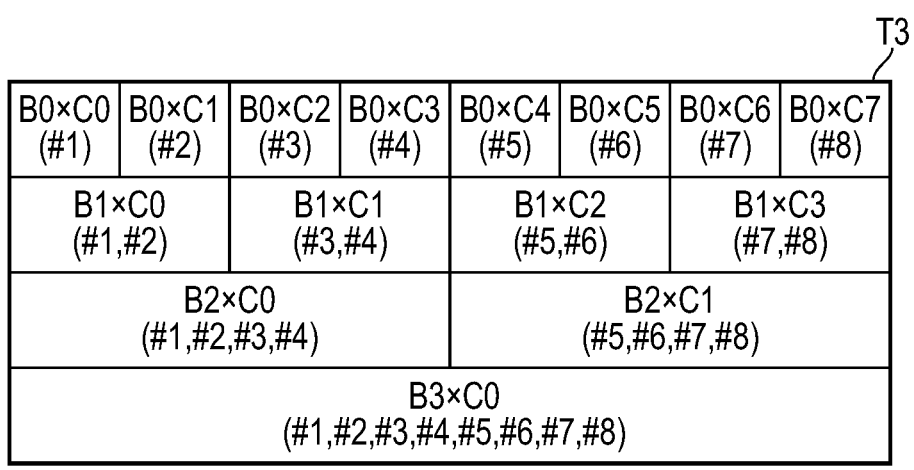
FIG. 19 is a diagram illustrating an example of a command table illustrating a relationship between each of combinations of two commands (BX commands and CX commands) and each of a plurality of write destination locations in block.

FIG. 19 is a diagram illustrating an example of a command table (CX command table) T3 illustrating a relationship between each of combinations of BX commands and CX commands and each of a plurality of write destination locations in the block.

Each of C0h to C7h combined with B0h is indicative of an offset from the starting location of eight MML groups to the write start MML group in a unit of 4 KiB (i.e., a unit of one MML group). For example, since C0h combined with B0h specifies the MML group #1 which exists at the starting location as the write start MML group, the combination of B0h and C0h specifies the MML group #1 as the write target MML group. Similarly, since C1h combined with B0h specifies the MML group #2 which exists at the location offset from the starting location by 4 KiB (=one MML group) as the write start MML group, the combination of B0h and C1h specifies the MML group #2 as the write target MML group. Similarly, since C7h combined with B0h specifies the MML group #8 which exists at the location offset from the starting location by 7×4 KiB (=7 MML groups) as the write start MML group, the combination of B0h and C7h specifies the MML group #8 as the write target MML group.

Each of C0h to C3h combined with B1h is indicative of an offset from the starting location of eight MML groups to the write start MML group in a unit of 8 KiB (i.e., a unit of two MML groups). For example, since C0h combined with B1h specifies the MML group #1 which exists at the starting location as the write start MML group, the combination of B1h and C0h specifies the MML group #1 and the MML group #2 as the write target MML groups. Since C1h combined with B1h specifies the MML group #3 which exists at the location offset from the starting location by 8 KiB (=two MML groups) as the write start MML group, the combination of B1h and C1h specifies the MML group #3 and the MML group #4 as the write target MML groups. Since C2h combined with B1h specifies the MML group #5 which exists at the location offset from the starting location by 2×8 KiB (=2×2 MML groups) as the write start MML group, the combination of B1h and C2h specifies the MML group #5 and the MML group #6 as the write target MML groups. Since C3h combined with B1h specifies the MML group #7 which exists at the location offset from the starting location by 3×8 KiB (=3×2 MML groups) as the write start MML group, the combination of B1h and C3h specifies the MML group #7 and the MML group #8 as the write target MML groups.

Each of C0h and C1h combined with B2h is indicative of an offset from the starting location of eight MML groups to the write start MML group in a unit of 16 KiB (i.e., a unit of four MML groups). For example, since C0h combined with B2h specifies the MML group #1 which exists at the starting location as the write start MML group, the combination of B2h and C0h specifies the MML group #1 to the MML group #4 as the write target MML groups. Since C1h combined with B2h specifies the MML group #5 which exists at the location offset from the starting location by 16 KiB (=four MML groups) as the write start MML group, the combination of B2h and C1h specifies the MML group #5 to the MML group #8 as the write target MML groups.

FIG. 20 is a diagram illustrating an example of several command sequences using a combination of BX commands and CX commands.

The command sequence (B0h-00h-80h-BlkAdd-Data(4 KiB)-10h) is used as a write command sequence which specifies the partial write mode and which specifies persistently storing the 4 KiB data in the starting part #1 of the block (i.e., starting MML group #1).

The command sequence (B0h-C1h-80h-BlkAdd-Data(4 KiB)-10h) is used as a write command sequence which specifies the partial write mode and which specifies persistently storing the 4 KiB data in the second part #2 of the block (i.e., MML group #2).

The command sequence (B1h-C1h-80h-BlkAdd-Data(8 KiB)-10h) is used as a write command sequence which specifies the partial write mode and which specifies persistently storing the 8 KiB data in the third part #3 and the fourth part #4 of the block (i.e., MML groups #3 and #4).

The command sequence (B2h-C1h-80h-BlkAdd-Data(16 KiB)-10h) is used as a write command sequence which specifies the partial write mode and which specifies persistently storing the 16 KiB data in the fifth part #5 to the eighth part #8 of the block (i.e., MML groups #5 to #8).

Figure 21:
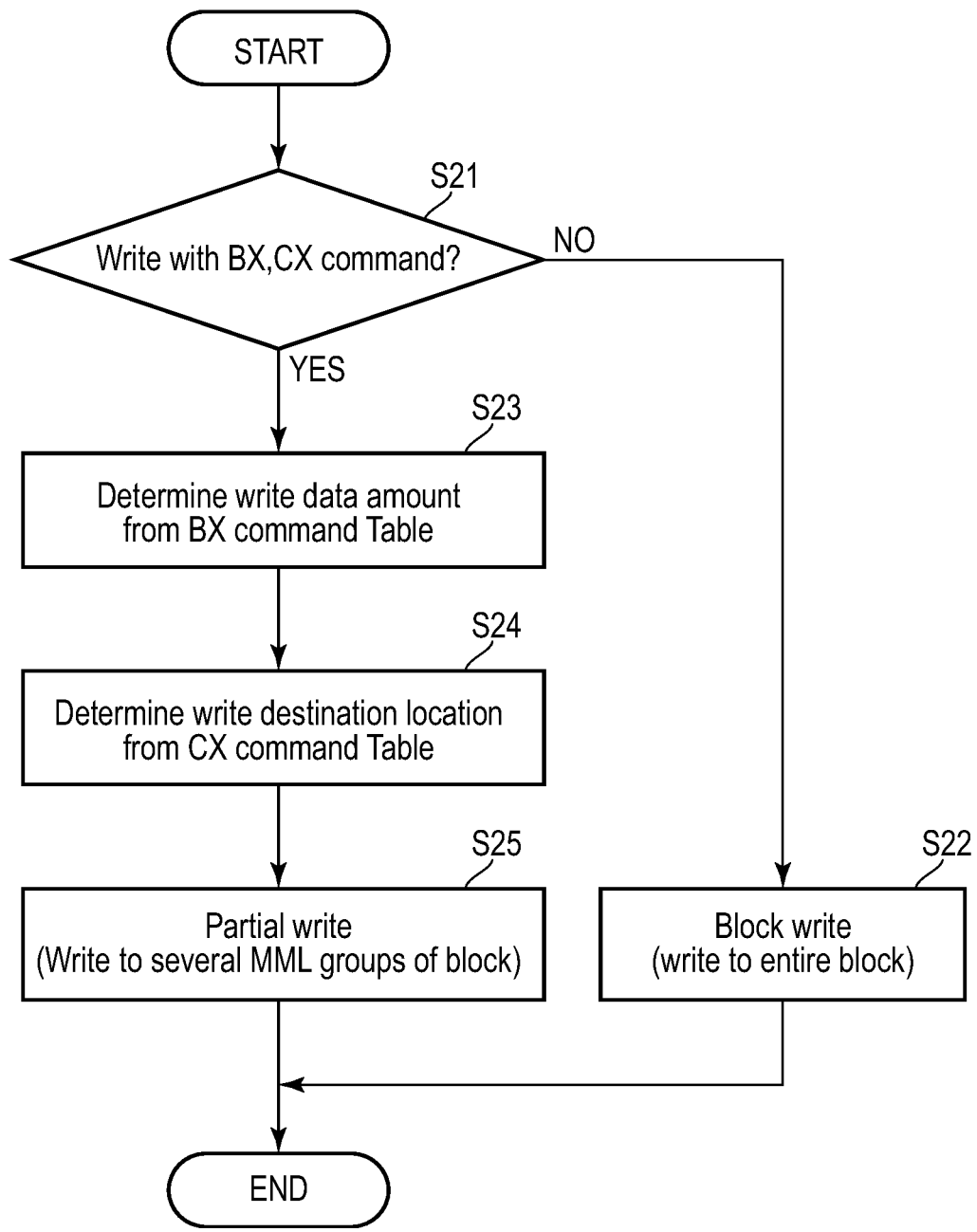
FIG. 21 is a flowchart illustrating another procedure of the write operation executed in the shift resister memory.

FIG. 21 is a flowchart illustrating another procedure of the write operation executed in the shift resister memory 3.

When receiving the write command sequence from the memory controller 2, the sequencer 34 of the shift register memory 3 determines whether the received write command sequence is a write command sequence including a combination of the BX command and the CX command or not (step S21).

When the received write command sequence is a write command sequence which does not include the combination of the BX command and the CX command (NO in step S21), the sequencer 34 determines that the received write command sequence is the write command sequence specifying the block write mode. Then, the sequencer 34 executes the block write operation (step S22). In step S12, the sequencer 34 writes the 32 KiB data transferred from the memory controller 2 to the shift register memory 3, to the entire write destination block specified by BlkAdd in the write command sequence.

In contrast, when the received write command sequence is a write command sequence which includes the combination of the BX command and the CX command (YES in step S21), the sequencer 34 determines that the received write command sequence is the write command sequence specifying the partial write mode.

In this case, the sequencer 34 first determines the size (i.e., write data amount) of the data to be written to the write destination block specified by BlkAdd in the write command sequence, by referring to the BX command table T2 based on the BX command in the write command sequence (step S23). Next, the sequencer 34 determines the write destination location in the write destination block (i.e., one or more write target MML groups of eight MML groups), by referring to the CX command table T3 based on the BX command and the CX command in the write command sequence (step S24). Then, the sequencer 34 executes the partial write operation of writing the data of the determined size to 512 layers of a plurality of magnetic memory lines MMLs included in one or more determined write target MML groups (step S25).

Next, specifying one or more specific magnetic memory lines MMLs as the write targets with the grain size finer than 64 MMLs will be described.

Figure 22:
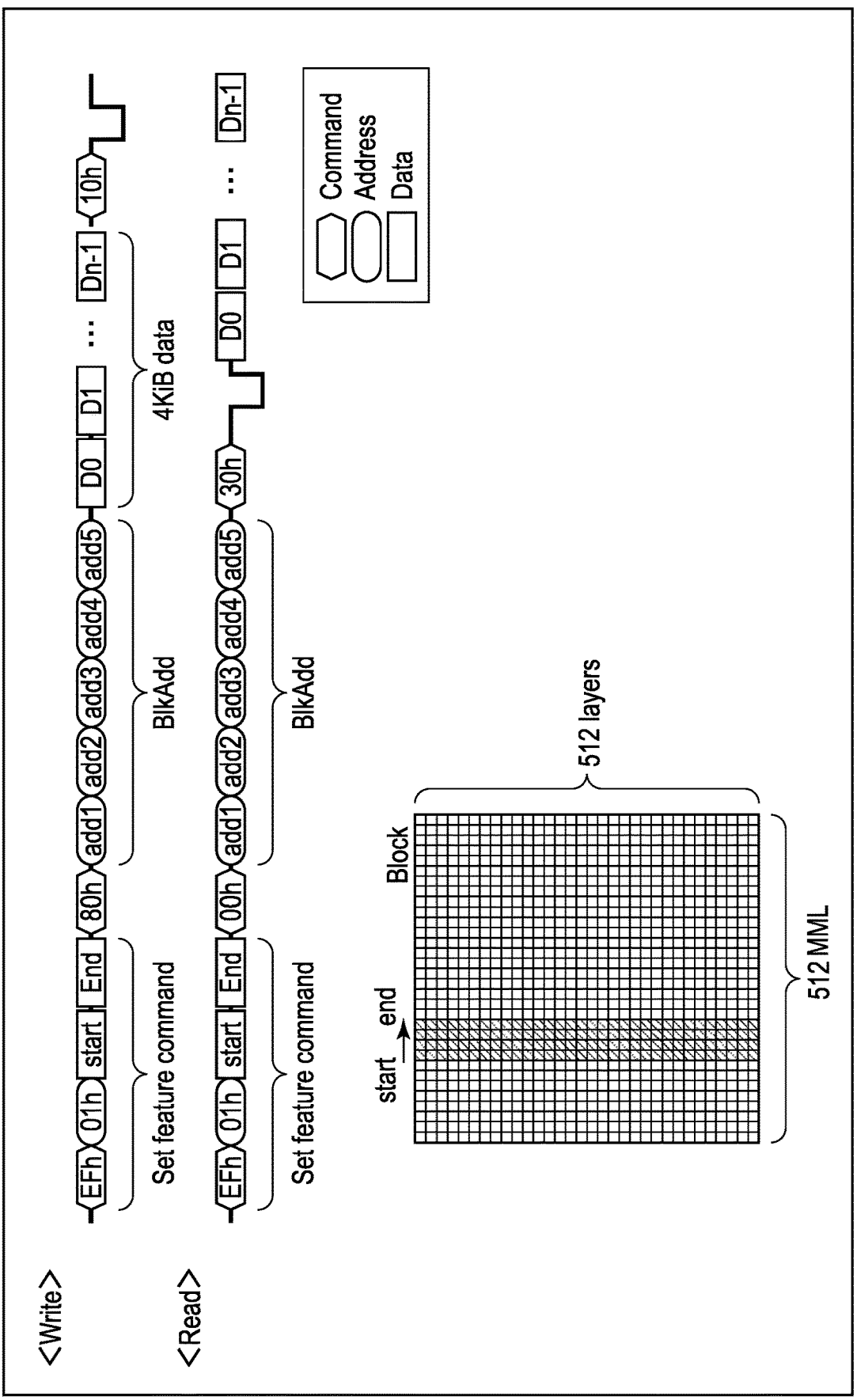
FIG. 22 is a diagram illustrating an example of a command sequence specifying a write start location and a write end location.

FIG. 22 is a diagram illustrating an example of a write command sequence specifying a write start location and a write end location.

The write command sequence specifying the write start location and the write end location is implemented by adding a set features command (command EFh, address and data) to the front of the starting command 80h of the write command sequence (80h-BlkAdd-Data-10h) specifying the block write mode illustrated in FIG. 7A.

The command EFh is a command to execute an additional function supported by the shift register memory 3. An address (for example, 01h) subsequent to the command EFh is used to specify the additional function to be executed. The data subsequent to the command EFh and the address specify a parameter necessary to execute the additional function. The set features command includes two data. One of the data is used as a parameter indicative of the write start location (start), and the other data is used as a parameter indicative of the write end location (end).

The parameter indicative of the write start location (start) specifies one of 512 magnetic memory lines MMLs in the block as the write start location. When the parameter indicative of the write start location (start) has a size of 1 byte, the write start location can be specified by resolution of 256 stages (two MMLs) from 00h to FFh.

The parameter indicative of the write end location (end) specifies one of 512 magnetic memory lines MMLs in the block as the write end location. When the parameter indicative of the write end location (end) has a size of 1 byte, the write end location can be specified by resolution of 256 stages (two MMLs) from 00h to FFh.

When receiving the write command sequence of FIG. 22 from the memory controller 2, the shift register memory 3 selects one or more magnetic memory lines MMLs included in the write target range from one magnetic memory line MML specified as the write start location to one magnetic memory line MML specified as the write end location, from 512 magnetic memory lines MMLs included in the write destination block specified by BlkAdd. Then, the shift register memory 3 repeats supplying the shift current to each of one or more selected magnetic memory lines MMLs, i.e., each of one or more magnetic memory lines MMLs included in the write target range, and thereby writes the data having a size corresponding to the capacities of one or more magnetic memory lines MMLs included in the write target range to 512 layers included in one or more magnetic memory lines MMLs included in the write target range.

The read command sequence specifying the read start location and the read end location can also be implemented by adding a set features command (command EFh, address 01h, and data) to the front of the starting command 00h of the command sequence for block read.

One of the data included in the set features command is used as a parameter indicative of the read start location (start), and the other data is used as a parameter indicative of the read end location (end).

When receiving the read command sequence of FIG. 22 from the memory controller 2, the shift register memory 3 selects one or more magnetic memory lines MMLs included in the read target range from one magnetic memory line MML specified as the read start location to one magnetic memory line MML specified as the read end location, from 512 magnetic memory lines MMLs included in the read target block specified by BlkAdd. Then, the shift register memory 3 repeats supplying the shift current for reading to each of one or more selected magnetic memory lines MMLs, i.e., each of one or more magnetic memory lines MMLs included in the read target range, and thereby reads the data having a size corresponding to the capacities of one or more magnetic memory lines MMLs included in the read target range from 512 layers included in the one or more magnetic memory lines MMLs included in the read target range.

As described above, according to the partial write operation of the first embodiment, the data are not written to all of the plurality of magnetic memory lines MMLs included in the write destination block, but the data having a size smaller than the block size are written to a plurality of layers included in several magnetic memory lines MMLs, of the plurality of magnetic memory lines MMLs included in the write destination block. The data are not written to each of the other magnetic memory lines MMLs except several magnetic memory lines MMLs. Therefore, the read target data can be read from the block by executing the only shift operation for several specific magnetic memory lines MMLs in which the read target data are stored. The shift operation for each of the other magnetic memory lines MMLs does not need to be executed.

Therefore, when the partial write operation of the first embodiment is used, the number of times of the shift operations executed for each of the magnetic memory lines MMLs in the block can be reduced to the minimum necessary number of times, and increase in the degree of wear of each of the magnetic memory lines MMLs in the block can be suppressed to be minimum necessary level.

Second Embodiment

Next, a partial write operation executed in a memory system 1 according to a second embodiment will be described. A hardware configuration of each of a memory controller 2 and a shift register memory 3 included in the memory system 1 according to the second embodiment is the same as the hardware configuration of each of the memory controller 2 and the shift register memory 3 included in the memory system 1 according to the first embodiment, and their descriptions are omitted below.

The partial write operation executed in the memory system 1 according to the second embodiment will be described below as the partial write operation of the second embodiment.

When receiving a write command sequence specifying a block write mode from the memory controller 2, a sequencer 34 of the shift register memory 3 executes a block write operation of writing data of a block size to an entire write destination block specified by BlkAdd in the received write command sequence. The block write operation is the same as the block write operation of the first embodiment.

When receiving a write command sequence specifying a partial write mode from the memory controller 2, the sequencer 34 of the shift register memory 3 writes data of a size smaller than the block size to a layer group which is a subset of a plurality of layers included in a plurality of magnetic memory lines MMLs included in the write destination block specified by BlkAdd in the received write command sequence. The layer group includes one or more layers adjacent to each other, of a plurality of layers included in the plurality of magnetic memory lines MMLs. Basically, each of the other layers except the layer group, of the plurality of layers included in the plurality of magnetic memory lines MMLs, is not used for writing the other data.

Figure 23:
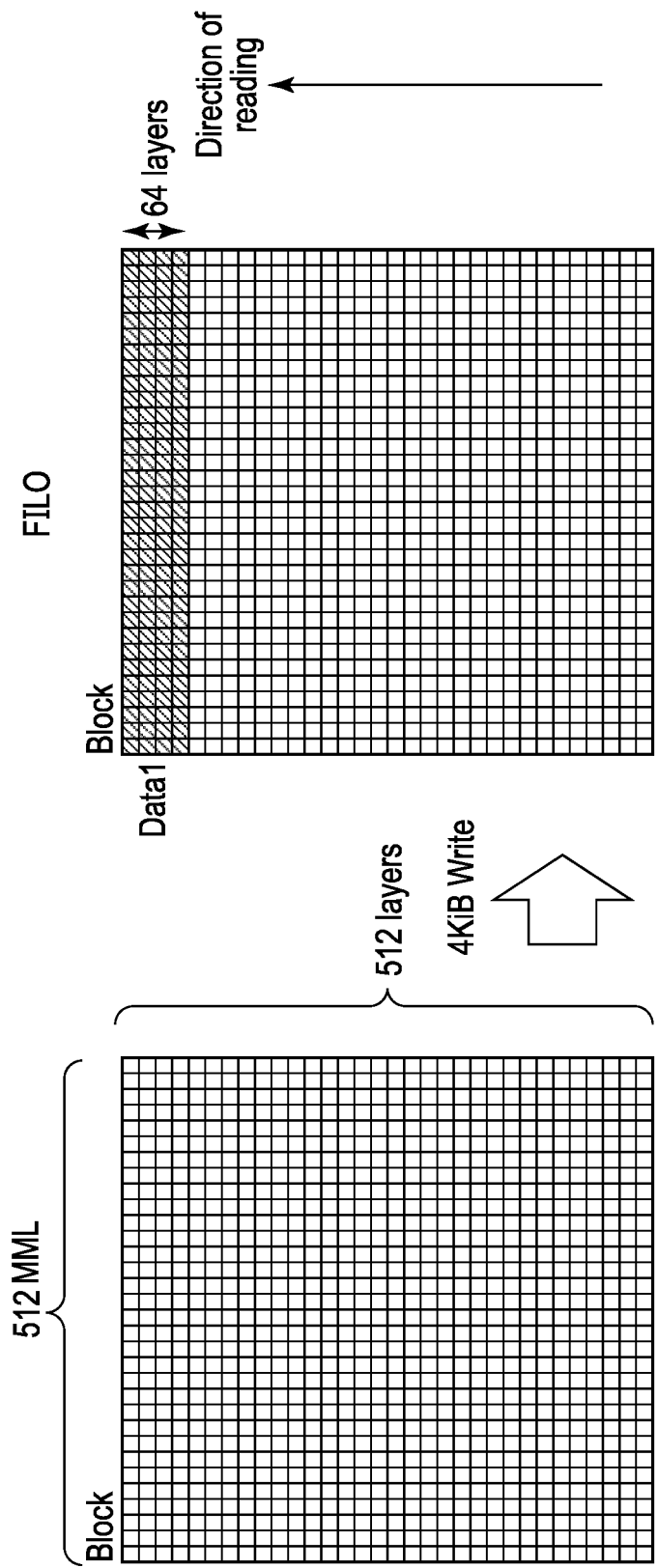
FIG. 23 is a diagram illustrating a partial write operation executed in a memory system according to a second embodiment.

Similarly to the first embodiment, an example of the partial write operation of the second embodiment will be described below by exemplifying a case where one block has a configuration of 512 MMLs×512 layers. FIG. 23 is a diagram illustrating the partial write operation according to the second embodiment.

In the partial write operation of the second embodiment, 4 KiB data are written to the layer group of 64 layers of 512 layers included in 512 magnetic memory lines MMLs in the block, i.e., an area of 64 layers×512 MMLs. The area other than the area of 64 layers×512 MMLs is not used for writing the other data.

In other words, when receiving a write command sequence specifying the partial write mode from the memory controller 2, the shift register memory 3 writes 4 KiB data to the layer group of 64 layers, of 512 layers included in 512 magnetic memory lines MMLs included in the write destination block specified by BlkAdd in the write command sequence, but does not execute further writing the data to each of 512 magnetic memory lines MMLs included in the write destination block.

More specifically, the shift register memory 3 executes the write operation, at a plurality of times (in this example, 64 times), including both an operation of inputting the data to a starting layer of each of 512 magnetic memory lines MMLs in the block and an operation of downwardly shifting the data stored in each layer of each of 512 magnetic memory lines MMLs by one layer. The shift register memory 3 thereby writes 4 KiB data (Data1) to 64 layers including the uppermost layer of the write destination block as illustrated in the right part of FIG. 23.

When the shift register memory 3 is implemented as a FILO type shift register memory such as a FILO type magnetic domain wall memory, the partial write operation is ended at the time when the 4 KiB data (Data1) are written to 64 layers including the uppermost layer of the write destination block. The 4 KiB data (Data1) are thereby stored in 64 layers including the starting layer (uppermost layer) of 512 magnetic memory lines MMLs. The starting layer (uppermost layer) is a layer which is first read in FILO method. Therefore, the 4 KiB data (Data1) can be read from the block by only repeating, at 64 times, the operation of shifting the data stored in each layer of each of 512 magnetic memory lines MMLs, by one layer, in a direction from the lowermost layer to the uppermost layer.

Furthermore, basically, after the 4 KiB data (Data1) are written to the block, the other data are not written to this block. Therefore, even in a case where a combination of the magnetization directions of the magnetizations of two adjacent layers in each MML is used as the information indicative of "1" or "0", 512-bit data written to the uppermost layer of this block do not need to be stored in a data storage area such as a latch circuit (or cache) in the shift register memory 3.

Furthermore, after the 4 KiB data (DATA1) are written to the block, the shift operation for each of the magnetic memory lines MMLs of this block is executed only when reading the 4 KiB data (Data1) is required. Therefore, the number of times of shift operations required to perform for each of the magnetic memory lines MMLs of this block can be reduced.

The write command sequence specifying the partial write mode is implemented by, for example, adding command XXh to the front of starting command 80h of the write command sequence (80h-BlkAdd-Data(32 KiB)-10h) specifying the block write mode.

In general, the unit size for updating the system data managed in the memory system 1 tends to be small and the system data tend to be frequently updated. Therefore, (1) a small unit size for the data write operation and data read operation, (2) high speed writing/high speed reading, (3)

high data reliability, and (4) high endurance are required for the storage area for storing the system data managed in the memory system 1.

When the partial write operation of the second embodiment is used, the memory use efficiency per block is lowered, but the requirements (1) to (4) for storage of the system data can be sufficiently satisfied.

Figure 24:
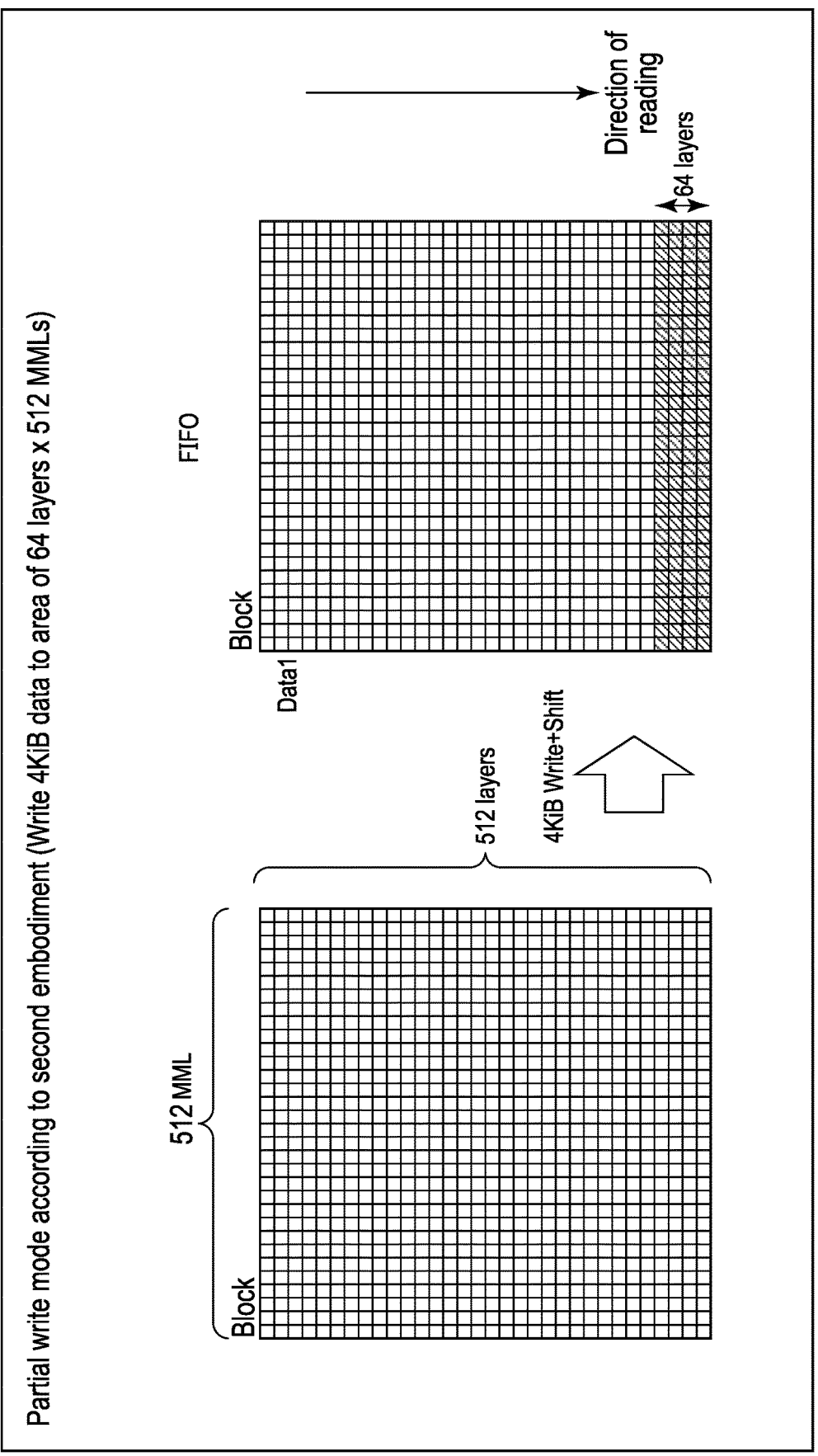
FIG. 24 is a diagram illustrating another partial write operation executed in the memory system according to the second embodiment.

When the shift register memory 3 is implemented as a FIFO type shift register memory such as a FIFO type magnetic domain wall memory, the shift register memory 3 repeats executing, at 448 times, the operation of shifting the data stored in each layer of each of 512 magnetic memory lines MMLs by one layer in the direction from the uppermost layer to the lowermost layer, without inputting the data to each of 512 magnetic memory lines MMLs, after the 4 KiB data (Data1) are written to 64 layers including the uppermost layer of the write destination block. As illustrated in the right part of FIG. 24, the 4 KiB data (Data1) are thereby stored in 64 layers including the end layer (lowermost layer) of 12 magnetic memory lines MMLs first read in FIFO. 448 layers on an upper layer side than 64 layers including the lowermost layer of this block are not used for storing the data.

Therefore, when reading the 4 KiB data (Data1) is required, the 4 KiB data (Data1) can be read from the block by only repeating, at 64 times, the operation of shifting the data stored in each layer of each of 512 magnetic memory lines MMLs, by one layer, in a direction from the uppermost layer to the lowermost layer.

Therefore, the number of times of the shift operations executed for each of the magnetic memory lines MMLs in the block can be reduced to the minimum necessary number of times, and increase in the degree of wear of each of the magnetic memory lines MMLs in the block can be suppressed to be minimum necessary level, as compared with the partial write operation of the comparative example.

Furthermore, since the 4 KiB data can be read by executing the shift operations at 64 times, a high speed read operation can be implemented as compared with the first embodiment in which the shift operations need to be executed at 256 times to read the 4 KiB data.

When the partial write operation of the second embodiment is used, the block to which the 4 KiB data is written includes a free area which is not used for writing the other 4 KiB data. To effectively use this free area, this free area may be used only for storage of specific data.

A process which enables rollback of the system data by storing the data of a previous version such as to-be-changed system data in the free area in the block will be described below.

Figure 25:
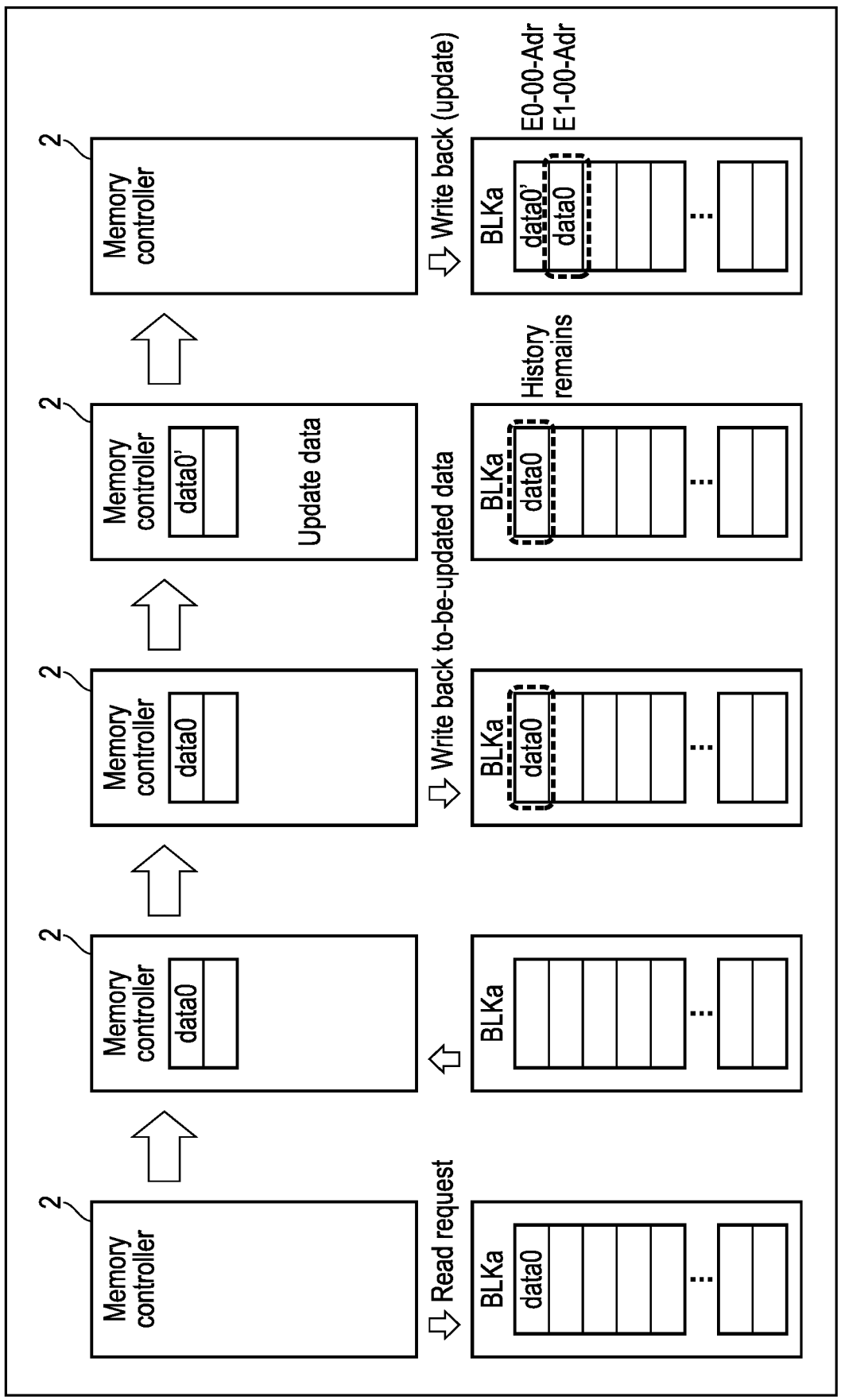
FIG. 25 is a diagram illustrating an operation of using a free area of the block for storage of data of a previous version.

FIG. 25 is a diagram illustrating an operation of using a free area of the block for storage of data of a previous version. A case where the shift register memory 3 is implemented as a shift register memory such as a FILO type magnetic domain wall memory will be exemplified, and the operation of storing the data of the previous version such as to-be-changed system data in a free area in the block will be described.

As illustrated in FIG. 25, data (data0) having a size of 4 KiB is stored in a block BLKa. The data (data0) is system data written to the block BLKa in the partial write mode of the second embodiment. Therefore, the data (data0) is stored in 64 layers including the uppermost layer of the block BLKa.

When the data (data0) needs to be updated, the memory controller 2 reads the data (data0) stored in the block BLKa from the shift register memory 3 and stores the read data (data0) to the data buffer 25. After that, the memory controller 2 writes back the read data (data0) from the data buffer 25 to the block BLKa as to-be-updated data (i.e., previous system data). The data (data0) is thereby stored in 64 layers including the uppermost layer of the block BLKa. In the process of writing back the to-be-updated data to the block BLKa, the memory controller 2 may transmit the write command sequence for partial write of the second embodiment to the shift register memory 3.

In the data buffer 25, the data (data0) is being retained. The memory controller 2 updates the data (data0) in the data buffer 25 to data (data0'). The memory controller 2 writes the updated data (data0') to the block BLKa as data of the latest version, such that the updated data (data0') is written to 64 layers including the uppermost layer of the block BLKa and that the data (data0) written back is shifted from 64 layers including the uppermost layer to 64 layers located on an lowermost layer side than 64 layers including the uppermost layer (i.e., 64 layers next to 64 layers including the uppermost layer). In the process of writing the updated data to the block BLKa as the data of the latest version, the memory controller 2 may transmit the write command sequence for partial write of the second embodiment to the shift register memory 3.

By the above process, the updated data (data0') is stored as the data of the latest version in 64 layers including the uppermost layer of the block BLKa, and the to-be-updated data (data0) is stored as the system data of the previous version in parts of the free area of the block BLKa (i.e., 64 layers next to 64 layers including the uppermost layer).

In a state in which system data of a plurality of generations are stored in the block BLKa, the shift register memory 3 can read the system data of any generation from the block BLKa in response to a request from the memory controller 2.

For example, when receiving a first read command sequence which requires the data of the latest version to be read, from the memory controller 2, the sequencer 34 of the shift register memory 3 reads the data (data0') stored in 64 layers including the uppermost layer of the read target block (in this example, block BLKa) specified by the first read command sequence, and transmits the read data (data0') to the memory controller 2.

When receiving a second read command sequence which requires the data of the previous version to be read, from the memory controller 2, the sequencer 34 of the shift register memory 3 reads the data (data0) stored in 64 layers next to 64 layers including the uppermost layer of the read target block (in this example, block BLKa) specified by the second read command sequence, and transmits the read data (data0) to the memory controller 2.

For example, the first read command sequence can be implemented by adding a specific command, for example, command E0H to the front of starting command 00h of the general read command sequence (00h-BlkAdd-30h). "0" of the command E0H functions as a parameter specifying the read target data of the latest version. The sequencer 34 of the shift register memory 3 may be configured to read the data stored in 64 layers including the uppermost layer (i.e., the data of the latest version), when receiving a read command sequence including no parameter for specifying the version of the read target data. In this case, the read command sequence including no parameter for specifying the version of the read target data can be used as the first read command sequence.

The second read command sequence can be implemented by E1H-00h-BlkAdd-30h. "1" of the command E1H functions as a parameter specifying the read target data of the previous version (i.e., a version of one generation before the latest version). The read command sequence for reading the system data of the version of two generations before the latest version can be implemented by E2H-00h-BlkAdd-30h. "2" of the command E2H functions as a parameter specifying the read target data of the version of two generations before the latest version.

As described above, according to the partial write operation of the second embodiment, the data are not written to all of a plurality of layers in each of a plurality of magnetic memory lines MMLs included in the write destination block but, for example, the data having a second size smaller than the block size are written only to a certain layer group (for example, a group of 64 layers including the uppermost layer) which is a subset of a plurality of layers in a plurality of magnetic memory lines MMLs, and each of the other layers, of the plurality of layers in the plurality of magnetic memory lines MMLs, is not used for writing the other data. Therefore, the number of times of the shift operations executed for each of the magnetic memory lines MMLs in the block can be reduced to the minimum necessary number of times, and increase in the degree of wear of each of the magnetic memory lines MMLs in the block can be suppressed to be minimum necessary level, as compared with the partial write operation of the comparative example. Furthermore, since the 4 KiB data can be read by executing the shift operations at 64 times, a high speed read operation can be implemented as compared with the first embodiment in which the shift operations need to be executed at 256 times to read the 4 KiB data.

Third Embodiment

Next, a partial write operation executed in a memory system 1 according to a third embodiment will be described. A hardware configuration of each of a memory controller 2 and a shift register memory 3 included in the memory system 1 according to the third embodiment is the same as the hardware configuration of each of the memory controller 2 and the shift register memory 3 included in the memory system 1 according to the first embodiment, and their descriptions are omitted below.

The partial write operation executed in the memory system 1 according to the third embodiment will be described below as the partial write operation of the third embodiment.

When receiving a write command sequence specifying a block write mode from the memory controller 2, a sequencer 34 of the shift register memory 3 executes a block write operation of writing data of a block size to an entire write destination block specified by BlkAdd in the received write command sequence. The block write operation is the same as the block write operation of the first embodiment.

When receiving a write command sequence specifying a partial write mode from the memory controller 2, the sequencer 34 of the shift register memory 3 does not write data to all of a plurality of magnetic memory lines MMLs included in the write destination block specified by BlkAdd in the received write command sequence, but writes data to only each of several magnetic memory lines MMLs, of a plurality of magnetic memory lines MMLs included in the write destination block, similarly to the partial write operation of the first embodiment. Furthermore, the sequencer 34 does not write the data to all of a plurality of layers included in several magnetic memory lines MMLs, but writes the data of a size smaller than the block size to a layer group which is a subset of a plurality of layers included in several magnetic memory lines MMLs, and does not use each of the other layers except the layer group for writing the data.

Figure 26:
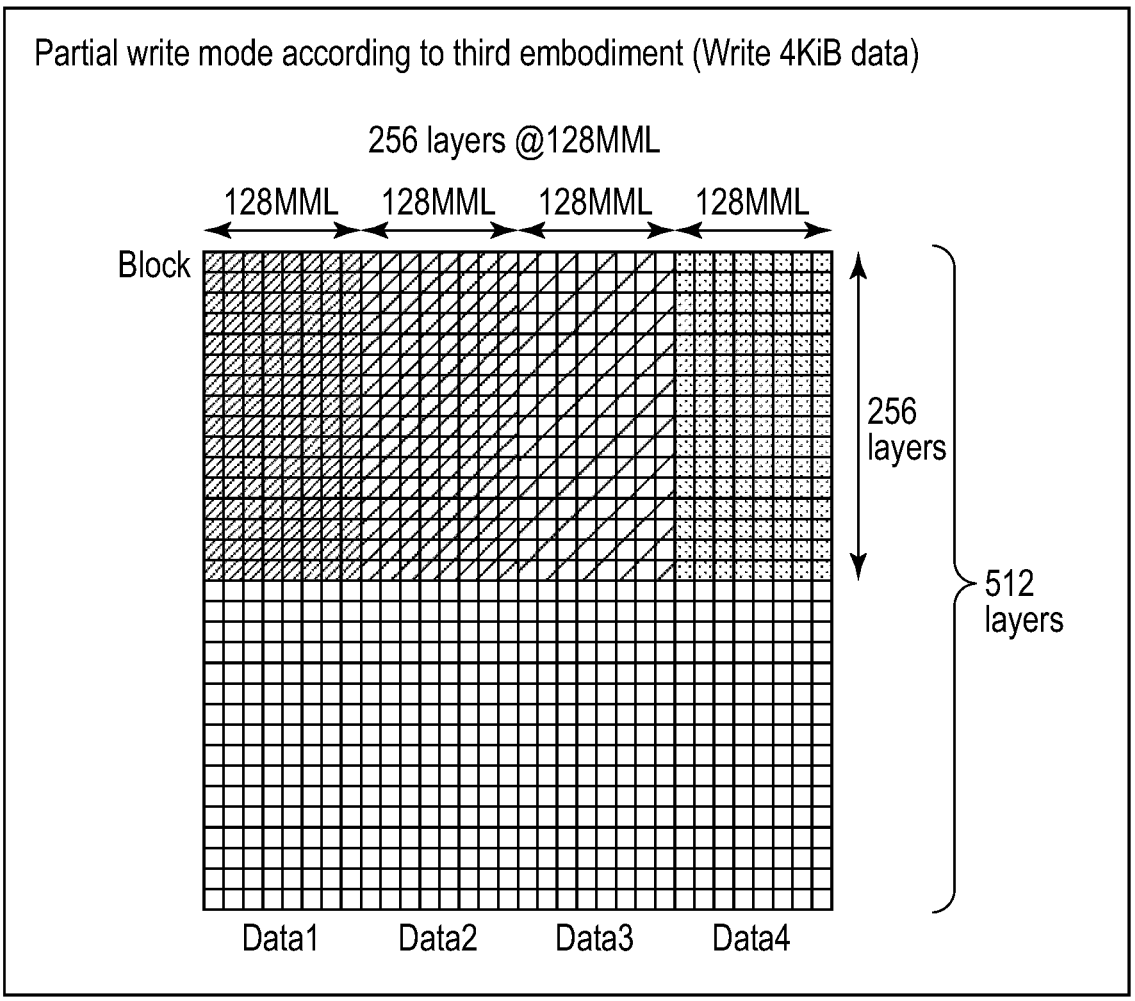
FIG. 26 is a diagram illustrating a partial write operation executed in a memory system according to a third embodiment.

Similarly to the first embodiment, an example of the partial write operation of the third embodiment will be described below by exemplifying a case where one block has a configuration of 512 MMLs×512 layers. FIG. 26 is a diagram illustrating the partial write operation according to the third embodiment.

In the partial write operation of the third embodiment, 512 magnetic memory lines MMLs in the block are divided into four groups (four MML groups) each including 128 magnetic memory lines MMLs. Then, a shift current is supplied only to each of 128 magnetic memory lines MMLs included in a specific MML group. 4 KiB data are thereby written to only 256 layers that are half of 512 layers included in 128 magnetic memory lines MMLs included in a specific MML group, i.e., an area of 256 layers×128 MMLs, in a state in which input of the data to each of the other MMLs and shift of the data stored in each layer of each of the other MMLs are prohibited.

That is, in the partial write operation of the third embodiment, the operation of supplying the shift current to each of 128 magnetic memory lines MMLs included in a specific MML group is repeated at 256 times, and 4 KiB data are thereby written to the area of 256 layers×128 MMLs. The remaining area of 256 layers×128 MMLs, in the specific MML group, is not used for writing the other data.

Thus, the partial write operation of the third embodiment is implemented by combining the partial write operation of the first embodiment and the partial write operation of the second embodiment. According to the partial write operation of the third embodiment, the time required to read the 4 KiB data can be made shorter than that in the partial write operation of the first embodiment, and the memory use efficiency can be more improved than the partial write operation of the second embodiment.

When the write command sequence for writing the data (Data1) having a size of 4 KiB in the partial write mode is input from the memory controller 2 to the shift register memory 3, the shift register memory 3 executes the write operation, at 256 times, including both the operation of inputting the data to the starting layer of 128 magnetic memory lines MMLs included in the MML group of the write target in the write destination block and the operation of downwardly shifting the data stored in each layer of each of 128 magnetic memory lines MMLs by one layer. As illustrated in FIG. 26, the 4 KiB data (Data1) are thereby written to 256 layers including the uppermost layer of 128 magnetic memory lines MMLs included in the write target MML group, i.e., the area of 256 layers×128 MMLs.

Thus, writing further data to each of 128 magnetic memory lines MMLs included in the writ target MML group is not executed. Therefore, even in a case where a combination of the magnetization directions of the magnetizations of two adjacent layers in each MML is used as the information indicative of "1" or "0", 128-bit data written to the uppermost layer in 128 magnetic memory lines MMLs do not need to be stored in a data storage area such as a latch circuit (or cache) in the shift register memory 3.

When the write command sequence for writing the data (Data2) having a size of 4 KiB in the partial write mode is input from the memory controller 2 to the shift register memory 3, the shift register memory 3 executes the write operation, at 256 times, including both the operation of inputting the data to the starting layer of 128 magnetic memory lines MMLs included in the MML group of a next write target in the write destination block and the operation of downwardly shifting the data stored in each layer of each of 128 magnetic memory lines MMLs by one layer. As illustrated in FIG. 26, data (Data2) are thereby written to 256 layers including the uppermost layer of 128 magnetic memory lines MMLs included in a next write target MML group, i.e., the area of 256 layers×128 MMLs.

Therefore, further writing the data to the 128 magnetic memory lines MMLs is not executed. Therefore, even in a case where a combination of the magnetization directions of the magnetizations of two adjacent layers in each MML is used as the information indicative of "1" or "0", 128-bit data written to the uppermost layer in 128 magnetic memory lines MMLs do not need to be stored in a data storage area such as a latch circuit (or cache) in the shift register memory 3.

Then, when the operation of writing the 4 KiB data to the area of 256 layers×128 MMLs is thus executed at four times, the data (Data1) having a size of 4 KiB are stored in 256 layers of 128 magnetic memory lines MMLs included in the first MML group in the write destination block, the data (Data2) having a size of 4 KiB are stored in 256 layers of 128 magnetic memory lines MMLs included in the second MML group in the write destination block, the data (Data3) having a size of 4 KiB are stored in 256 layers of 128 magnetic memory lines MMLs included in the third MML group in the write destination block, and the data (Data4) having a size of 4 KiB are stored in 256 layers of 128 magnetic memory lines MMLs included in the fourth MML group in the write destination block.

In this state, when certain 4 KiB data need to be read, only 4 KiB data of the read target can be read from the block by only repeating at 256 times the shift operation for not all of 512 magnetic memory lines MMLs, but 128 magnetic memory lines MMLs in which 4 KiB data of the read target are stored.

For example, in the FILO type shift register memory such as the FILO type magnetic domain wall memory, when the read target data are the data (Data1), the only data (Data1) can be read from the block by only supplying the shift current to each of 128 magnetic memory lines MMLs included in the first MML group, at 256 times. The shift operation for each of the other magnetic memory lines MMLs does not need to be executed.

Similarly, when the read target data are the data (Data4), the only data (Data4) can be read from the block by only supplying the shift current to each of 128 magnetic memory lines MMLs included in the fourth MML group, at 256 times. The shift operation for each of the other magnetic memory lines MMLs does not need to be executed.

In the FIFO type shift register memory such as the FIFO type magnetic domain wall memory, the 4 KiB data may be written to 256 layers including the lowermost layer of 128 magnetic memory lines MMLs included in each MML group.

FIG. 27 is a diagram illustrating a maximum read shift count, a minimum read shift count, and a memory effective use rate on each of the partial write operation according to the comparative example, the partial write operation according to the first embodiment, the partial write operation according to the second embodiment, and the partial write operation according to the third embodiment.

The maximum number of times of read shift (maximum read shift count) is indicative of the maximum value of the number of times of shift considered necessary to read the 4 KiB data from the block. The minimum number of times of read shift (minimum read shift count) is indicative of the minimum value of the number of times of shift considered necessary to read the 4 KiB data from the block.

In the partial write operation according to the comparative example, eight 4 KiB data are stored in eight areas of 64 layers×512 MMLs in the block. Therefore, the maximum number of times of shift is the number of times of shift (=512 times) considered necessary to read the 4 KiB data stored in 64 layers including the lowermost layer. The minimum number of times of read shift is the number of times of shift (=64 times) considered necessary to read the 4 KiB data stored in 64 layers including the uppermost layer. The memory use efficiency is 100%.

In the partial write operation according to the first embodiment, eight 4 KiB data are written to eight areas of 512 layers×64 MMLs in the block, respectively. The number of times of shift necessary to read each 4 KiB data is 512. Therefore, each of the maximum number of times of read shift and the minimum number of times of read shift is 512. The memory use efficiency is 100%.

In the partial write operation according to the second embodiment, the 4 KiB data are stored in the only uppermost area (or the lowermost area) in eight areas of 64 layers×512 MMLs in the block. Therefore, each of the maximum number of times of read shift and the minimum number of times of read shift is 64. The memory use efficiency is 12.5%.

In the partial write operation according to the third embodiment, a half area of each of four areas of 512 layers×128 MMLs in the block (i.e., an area of 256 layers× 128 MMLs) is used for storage of the 4 KiB data. Therefore, each of the maximum number of times of read shift and the minimum number of times of read shift is 256. The memory use efficiency is 50%.

Figure 28:
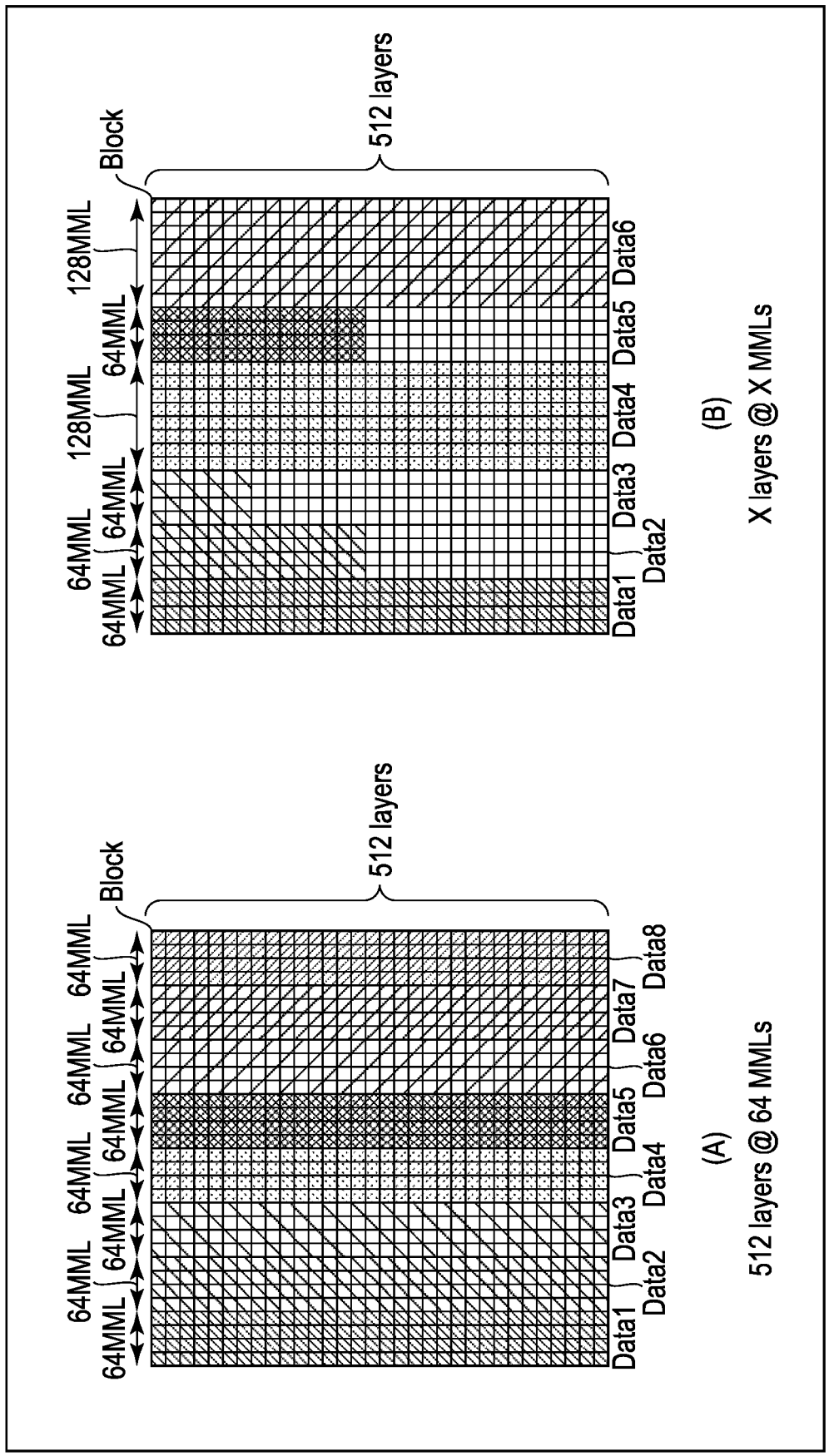
FIG. 28 is a diagram illustrating a partial write operation of writing data of any size to the block by using any number of layers and any number of MMLs.

Next, an expanded partial write operation that can be used for writing in various sizes will be described as an applied example of the partial write operation of the third embodiment, with reference to FIG. 28. (A) of FIG. 28 illustrates the partial write operation of the first embodiment. (B) of FIG. 28 illustrates an expanded partial write operation of writing the data of any size to the block by using any number of layers and any number (i.e., an integral multiple of 64) of MMLs.

It is assumed below that 512 magnetic memory lines MMLs in the block are divided into eight groups (i.e., eight MML groups) each including 64 magnetic memory lines MMLs, similarly to the first embodiment.

In (B) of FIG. 28, the data (Data1) having a size of 4 KiB are written to 512 layers of 64 magnetic memory lines MMLs included in the first MML group, i.e., an area of 512 layers×64 MMLs.

The data (Data2) having a size of 2 KiB are written to 256 layers of 512 layers of 64 magnetic memory lines MMLs included in the second MML group, i.e., an area of 256 layers×64 MMLs.

The data (Data3) having a size of 1 KiB are written to 128 layers of 512 layers of 64 magnetic memory lines MMLs included in the third MML group, i.e., an area of 128 layers×64 MMLs.

The data (Data4) having a size of 8 KiB are written to 512 layers of 128 magnetic memory lines MMLs included in the fourth MML group and the fifth MML group, i.e., an area of 512 layers×128 MMLs.

The data (Data5) having a size of 2 KiB are written to 256 layers of 64 magnetic memory lines MMLs included in the sixth MML group, i.e., an area of 256 layers×64 MMLs.

The data (Data6) having a size of 8 KiB are written to 512 layers of 128 magnetic memory lines MMLs included in the seventh MML group and the eighth MML group, i.e., an area of 512 layers×128 MMLs.

The write command sequence specifying the expanded partial write operation which can be used for writing of various sizes can be implemented by adding the command DXh specifying the size of the data to be written to the block, to the write command sequence (AXh-80h-BlkAdd-Data-10h) of the first embodiment. In the following descriptions, the command DXh is also referred to as a DX command or D command.

Figure 29:
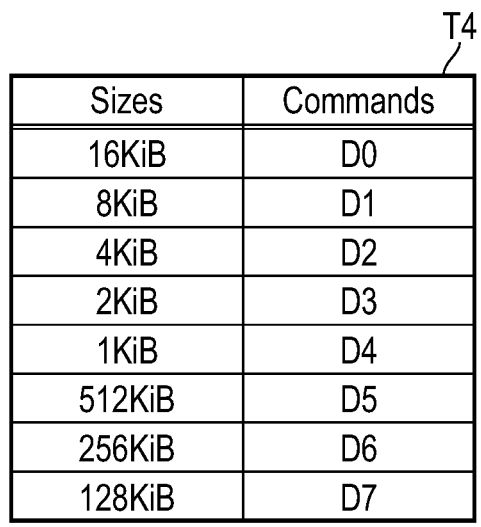
FIG. 29 is a diagram illustrating an example of a command table indicative of a relationship between each of DX commands and each of data sizes.

As illustrated in a DX command table T4 of FIG. 29, the size of 16 KiB is allocated to the command D0h. The size of 8 KiB is allocated to a command D1h. The size of 4 KiB is allocated to a command D2h. The size of 2 KiB is allocated to a command D3h. The size of 1 KiB is allocated to a command D4h. The size of 512B is allocated to a command D5h. The size of 256B is allocated to a command D6h. The size of 128B is allocated to a command D7h.

Figure 30:
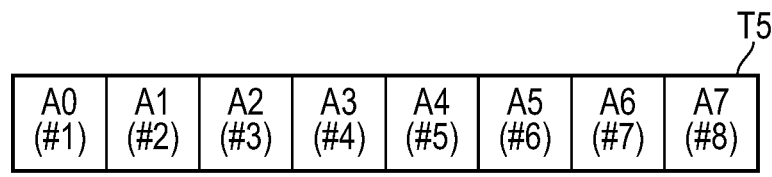
FIG. 30 is a diagram illustrating an example of a relationship between each of AX commands and each of write destination locations in block.

Furthermore, as illustrated in a table of FIG. 30, the MML group #1 to MML group #8 are allocated as the write destination locations to commands A0h to A7h, respectively.

Figure 31:
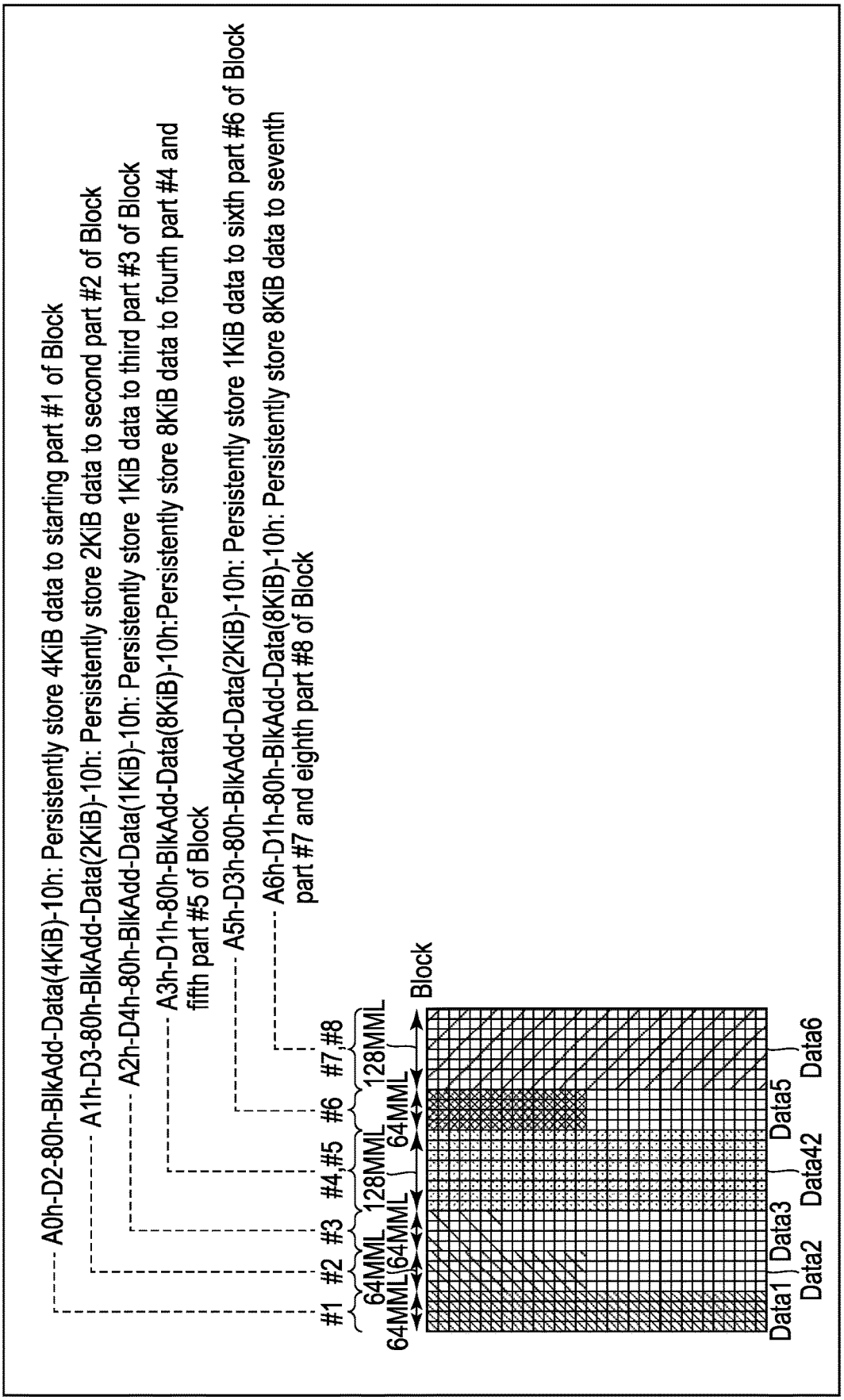
FIG. 31 is a diagram illustrating an example of several command sequences using a combination of two commands (AX command and DX command).

FIG. 31 is a diagram illustrating an example of several command sequences using a combination of two commands (AX commands and DX commands).

The command sequence (A0h-D2h-80h-BlkAdd-Data(4 KiB)-10h) is used as a write command sequence which specifies the partial write mode and which specifies persistently storing the 4 KiB data in the starting part #1 of the block (i.e., starting MML group #1).

The command sequence (A1h-D3h-80h-BlkAdd-Data(2 KiB)-10h) is used as a write command sequence which specifies the partial write mode and which specifies persistently storing the 2 KiB data in the second part #2 of the block (i.e., MML group #2). When receiving this write command sequence from the memory controller 2, the shift register memory 3 writes the data to only 256 layers of 512 layers of 64 magnetic memory lines MMLs included in the MML group #2. Remaining 256 layers are not used for storage of the data.

The command sequence (A2h-D4h-80h-BlkAdd-Data(1 KiB)-10h) is used as a write command sequence which specifies the partial write mode and which specifies persistently storing the 1 KiB data in the third part #3 of the block (i.e., MML group #3). When receiving this write command sequence from the memory controller 2, the shift register memory 3 writes the data to only 128 layers of 512 layers of 64 magnetic memory lines MMLs included in the MML group #3. Remaining 384 layers are not used for storage of the data.

The command sequence (A3h-D1h-80h-BlkAdd-Data(8 KiB)-10h) is used as a write command sequence which specifies the partial write mode and which specifies persistently storing the 8 KiB data in the fourth part #4 and the fifth part #5 of the block (i.e., MML groups #4 and #5).

The command sequence (A5h-D3h-80h-BlkAdd-Data(2 KiB)-10h) is used as a write command sequence which specifies the partial write mode and which specifies persistently storing the 2 KiB data in the sixth part #6 of the block (i.e., MML group #6). When receiving this write command sequence from the memory controller 2, the shift register memory 3 writes the data to only 256 layers of 512 layers of 64 magnetic memory lines MMLs included in the MML group #6. Remaining 256 layers are not used for storage of the data.

The command sequence (A6h-D1h-80h-BlkAdd-Data(8 KiB)-10h) is used as a write command sequence which specifies the partial write mode and which specifies persistently storing the 8 KiB data in the seventh part #7 and the eighth part #8 of the block (i.e., MML groups #7 and #8).

As described above, according to the third embodiment, the data having a size smaller than the block size can be written not to all of a plurality of layers included in several magnetic memory lines MMLs, of the plurality of magnetic memory lines MMLs included in the write destination block, but to the layer group which is a subset of a plurality of layers included in several magnetic memory lines MMLs. Moreover, the data are not written to each of the other layers except the layer group, of the plurality of layers included in the several magnetic memory lines MMLs.

Therefore, similarly to the partial write operation of the first embodiment, the number of times of the shift operations executed for each of the magnetic memory lines MMLs in the block can be reduced to the minimum necessary number of times, and increase in the degree of wear of each of the magnetic memory lines MMLs in the block can be suppressed to be minimum necessary level.

Furthermore, according to the third embodiment, the time required to read the data can be made shorter than that in the partial write operation of the first embodiment, and the memory use efficiency can be more improved than the partial write operation of the second embodiment.

Incidentally, in the first embodiment, second embodiment, and third embodiment described above, the case where each block has a configuration of 512 layers×512 MMLs has been exemplified. However, the configuration of each block is not limited to the configuration of 512 layers×512 MMLs, but other various configurations can be used. In addition, the size of the data written by the partial write operation is not limited to 4 KiB, but data of various sizes can be written to several areas in the block by the partial write operation.

Therefore, for example, the number of magnetic memory lines MMLs included in each MML group used in the first to third embodiments may be one or more. In addition, the multiple layers do not need to be included in one layer group used in the second embodiment and the third embodiment. The number of layers included in one layer group may be one or more.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a shift register memory configured to comprise a block including a plurality of shift strings, each of the plurality of shift strings including a plurality of layers; each of the plurality of shift strings extending in one direction, and to execute writing and reading data by a first-in last-out method or a first-in first-out method by repeating a single operation of shifting data stored in each of the layers of each of the plurality of shift strings, by a layer of the layers of each of the plurality of shift strings, in a direction along each of the plurality of shift strings; and a controller configured to control the shift register memory by selectively using a first write mode and a second write mode, wherein the plurality of shift strings of the block are logically divided into a plurality of shift string groups, each of the plurality of shift string groups including one or more shift strings, the shift resister memory is configured to:

in response to a first command sequence specifying the first write mode from the controller, write data having a first size corresponding to a capacity of the block to the plurality of layers of the plurality of shift strings by supplying a shift current to each of the plurality of shift string groups; and in response to a second command sequence specifying the second write mode from the controller, the second command sequence further specifying a shift string group of the plurality of shift string groups, write data having a second size smaller than the capacity of the block to the plurality of layers of one or more first shift strings included in the specified shift string group by supplying the shift current to the specified string group, without supplying the shift current to each of other shift string groups except the specified shift string group.

2. The memory system of claim 1, wherein the shift resister memory is configured to:

write the data having the first size to the plurality of layers of the plurality of shift strings by executing first write operation a number of times corresponding to the number of the plurality of layers of each of the plurality of shift strings, the first write operation being executed by supplying the shift current to each of the plurality of shift string groups, the first write operation including both an operation of inputting data to a starting layer of each of the plurality of shift strings and an operation of shifting data stored in each layer of the plurality of shift strings by a layer of the layers of each of the plurality of shift strings in a first direction from the starting layer of each of the shift strings to an end layer of each of the shift strings; and write the data having the second size to the plurality of layers of the one or more first shift strings by executing a second write operation the number of times corresponding to the number of the plurality of layers of each of the plurality of shift strings, the second write operation being executed by supplying the shift current to the specified shift string groups, without supplying the shift current to each of the other shift string groups except the specified shift string group, the second write operation including both an operation of inputting data to a starting layer of each of the one or more first shift strings and an operation of shifting data stored in each layer of each of the one or more first shift strings by a layer of the layers of each of the one or more first shift strings in the first direction, without executing input of data to each of the other shift strings except the one or more first shift strings and shift of data stored in each layer of each of the other shift strings.

3. The memory system of claim 1, wherein the second command sequence includes a first command code specifying a shift string group of the plurality of shift string groups as a write destination location.

4. The memory system of claim 1, wherein the second command sequence includes a first command code, the first command code specifies a size of data to be written to the block and specifies one or more shift string groups of the plurality of shift string groups, all the plurality of shift string groups have a same size, a size of the data to be written to the block is an integral multiple of capacity of each one of the plurality of shift string groups, and the shift resister memory is configured to:

determine the size of the data to be written to the block, and one or more write target shift string groups of the plurality of shift string groups, based on the first command code of the second command sequence; and write the data of the determined size to the plurality of layers of shift strings included in the determined one or more write target shift string groups.

5. The memory system of claim 1, wherein the second command sequence includes a first command code specifying a size of data to be written to the block and a second command code specifying offset from a starting location of the plurality of shift string groups to a write start shift string group of the plurality of shift string groups, the offset being specified in a unit of the size of the data specified by the first command code, all the plurality of shift string groups have a same size, a size of the data to be written to the block is an integral multiple of capacity of each one of the plurality of shift string groups, and the shift resister memory is configured to:

determine the size of the data to be written to the block, based on the first command code; and determine one or more write target shift string groups of the plurality of shift string groups, based on a combination of the first command code and the second command code; and write the data of the determined size to the plurality of layers of shift strings included in the determined one or more write target shift string groups.

6. A memory system comprising:

a shift register memory configured to comprise a block including a plurality of shift strings, each of the plurality of shift strings including a plurality of layers, each of the plurality of shift strings extending in one direction, and to execute writing and reading data by a first-in last-out method or a first-in first-out method by repeating a single operation of shifting data stored in each of the layers of each of the plurality of shift strings, by a layer of the layers of each of the plurality of shift strings, in a direction along each of the plurality of shift strings; and a controller configured to control the shift register memory by selectively using a first write mode and a second write mode, wherein the plurality of shift strings of the block are logically divided into a plurality of shift string groups, each of the plurality of shift string groups including one or more shift strings, the shift resister memory is configured to:

in response to a first command sequence specifying the first write mode from the controller, write data having a first size corresponding to a capacity of the block to the plurality of layers of the plurality of shift strings by supplying a shift current to each of the plurality of shift string groups; and in response to a second command sequence specifying the second write mode from the controller, the second command sequence further specifying a shift string group of the plurality of shift string groups, write data having a second size smaller than a capacity of the block to a first layer group of one or more first shift strings included in the specified shift string group by supplying the shift current to the specified string group, without supplying the shift current to each of other shift string groups except the specified shift string group and not use each of other layers of the first shift strings except the first layer group, the first layer group being a subset of the plurality of layers of the one or more first shift strings, the first layer group including layers adjacent to each other, of the plurality of layers of each of the one or more first shift strings.

7. The memory system of claim 6, wherein the shift resister memory is configured to:

write the data having the first size to the plurality of layers of the plurality of shift strings by executing a first write operation a number of times corresponding to the number of the plurality of layers, the first write operation being executed by supplying the shift current to each of the plurality of shift string groups, the first write operation including both an operation of inputting data to a starting layer of each of the plurality of shift strings and an operation of shifting data stored in each layer of the plurality of shift strings by a layer of the layers of each of the plurality of shift strings in a first direction from the starting layer of each of the shift strings to an end layer of each of the shift strings; and write the data having the second size to the first layer group of the one or more first shift strings by executing a second write operation a plurality of times, without executing input of data to each of the other shift strings except the one or more first shift strings and shift of data stored in each layer of each of the other shift strings, the second write operation being executed supplying the shift current to the specified shift string, groups, without supplying the shift current to each of the other shift string groups except the specified shift string group, the second write operation including both an operation of inputting data to a starting layer of each of the one or more first shift strings and an operation of shifting data stored in each layer of each of the one or more first shift strings by a layer of the layers of each of the one or more first shift strings in the first direction.

8. The memory system of claim 6, wherein when the shift register memory is a first type shift register memory configured to execute writing and reading data in the first-in last-out method, the first layer group is layers including a starting layer of each of the one or more first shift strings, from which data is first read in the first-in last-out method.

9. The memory system of claim 6, wherein when the shift register memory is a second type shift register memory configured to execute writing and reading data in the first-in first-out method, the first layer group is layers including an end layer of each of the one or more first shift strings, from which data is first read in the first-in first-out method.

* * * * *